United States Patent
Kasahara et al.

(10) Patent No.: US 7,557,412 B2
(45) Date of Patent: Jul. 7, 2009

(54) SEMICONDUCTOR DEVICE AND METHOD OF MANUFACTURING THE SAME

(75) Inventors: Kenji Kasahara, Kanagawa (JP); Shinji Maekawa, Kanagawa (JP); Hiroshi Shibata, Kanagawa (JP); Hidekazu Miyairi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 1 day.

(21) Appl. No.: 11/788,322

(22) Filed: Apr. 18, 2007

(65) Prior Publication Data

US 2007/0196969 A1    Aug. 23, 2007

Related U.S. Application Data

(62) Division of application No. 10/141,451, filed on May 8, 2002, now Pat. No. 7,211,476.

(30) Foreign Application Priority Data

May 10, 2001   (JP)   ............... 2001-139537
Sep. 21, 2001  (JP)   ............... 2001-289096

(51) Int. Cl.
     *H01L 21/84* (2006.01)
(52) U.S. Cl. .............. 257/347; 257/E21.561; 438/166
(58) Field of Classification Search ......... 257/347–354, 257/E21.561; 438/151–166
     See application file for complete search history.

(56) References Cited

U.S. PATENT DOCUMENTS

| 4,552,595 | A | 11/1985 | Hoga |
| 4,576,851 | A | 3/1986 | Iwamatsu |
| 4,589,951 | A | 5/1986 | Kawamura |
| 4,609,403 | A | 9/1986 | Wittwer et al. |
| 4,609,407 | A | 9/1986 | Masao et al. |
| 4,719,123 | A | 1/1988 | Haku et al. |
| 4,814,292 | A | 3/1989 | Sasaki et al. |
| 5,147,826 | A | 9/1992 | Liu et al. |
| 5,306,651 | A | 4/1994 | Masumo et al. |
| 5,313,076 | A | 5/1994 | Yamazaki et al. |
| 5,352,291 | A | 10/1994 | Zhang et al. |
| 5,569,610 | A * | 10/1996 | Zhang et al. ............... 438/166 |
| 5,578,520 | A | 11/1996 | Zhang et al. |
| 5,627,084 | A | 5/1997 | Yamazaki et al. |

(Continued)

FOREIGN PATENT DOCUMENTS

JP            08-078329        3/1996

(Continued)

*Primary Examiner*—Richard A. Booth
(74) *Attorney, Agent, or Firm*—Cook Alex Ltd.

(57) ABSTRACT

The sizes of crystal masses are made to be a uniform in a crystalline silicon film obtained by a thermal crystallization method in which a metal element is used. An amorphous silicon film to be crystallized is doped with a metal element that accelerates crystallization, and then irradiated with laser light (with an energy which is not large enough to melt the film and which is large enough to allow the metal element to diffuse in the solid silicon film) from the back side of a light-transmissive substrate. Thereafter, heat treatment is performed to obtain a crystalline silicon film. Thus crystal masses in the crystalline silicon film can have a uniform size and the problem of fluctuation between TFTs can be solved.

19 Claims, 18 Drawing Sheets

U.S. PATENT DOCUMENTS

| | | | |
|---|---|---|---|
| 5,861,337 | A | 1/1999 | Zhang et al. |
| 5,869,362 | A | 2/1999 | Ohtani |
| 5,893,730 | A * | 4/1999 | Yamazaki et al. ........... 438/166 |
| 6,174,374 | B1 | 1/2001 | Zhang et al. |
| 6,281,552 | B1 | 8/2001 | Kawasaki et al. |
| 6,346,730 | B1 | 2/2002 | Kitakado et al. |
| 6,358,766 | B1 | 3/2002 | Kasahara |
| 6,362,507 | B1 | 3/2002 | Ogawa et al. |
| 6,410,368 | B1 | 6/2002 | Kawasaki et al. |
| 6,426,245 | B1 | 7/2002 | Kawasaki et al. |
| 6,494,162 | B1 | 12/2002 | Zhang et al. |
| 6,524,877 | B1 | 2/2003 | Nakazawa et al. |
| 6,548,370 | B1 | 4/2003 | Kasahara et al. |
| 6,555,875 | B2 | 4/2003 | Kawasaki et al. |
| 6,770,143 | B2 | 8/2004 | Zhang et al. |
| 2001/0045558 | A1 | 11/2001 | Kawasaki et al. |
| 2002/0004292 | A1 | 1/2002 | Yamazaki et al. |
| 2002/0048864 | A1 | 4/2002 | Yamazaki et al. |
| 2002/0058364 | A1 | 5/2002 | Kitakado et al. |
| 2002/0146874 | A1 | 10/2002 | Kawasaki et al. |

FOREIGN PATENT DOCUMENTS

| | | |
|---|---|---|
| JP | 09-171965 | 6/1997 |

* cited by examiner

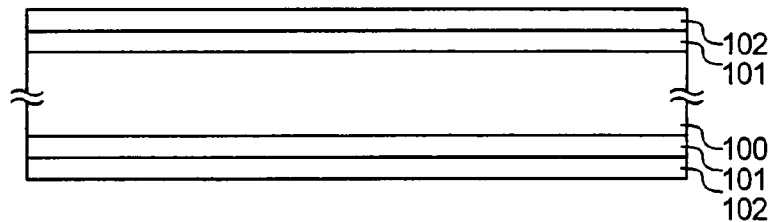
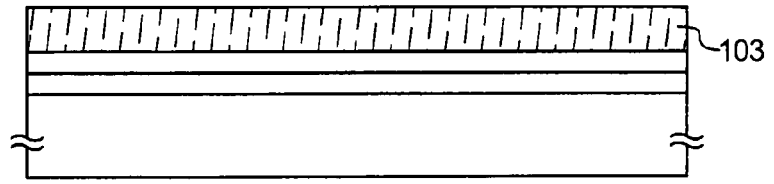
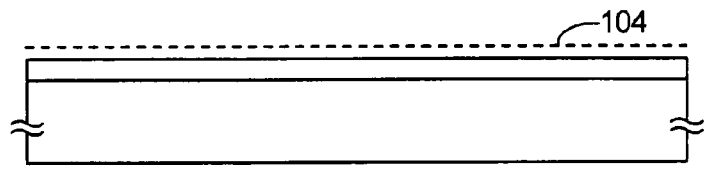
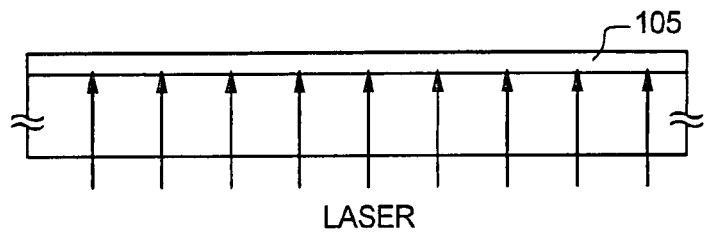
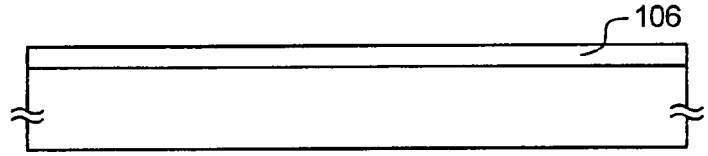
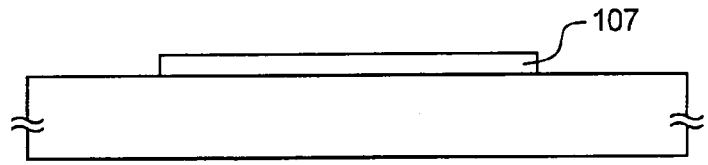
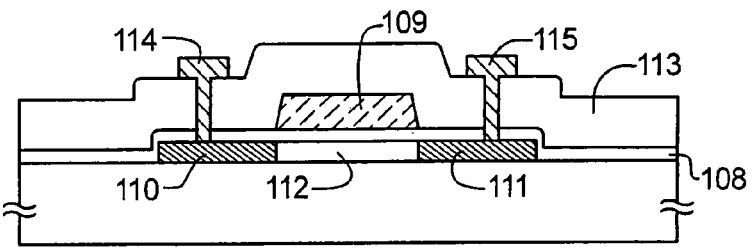

SEMICONDUCTOR DEVICE AND METHOD OF MANUFACTURING THE SAME

This application is a divisional of prior application Ser. No. 10/141,451 filed May 8, 2002 now U.S. Pat. No. 7,211,476.

BACKGROUND OF THE INVENTION

1. Field of the Invention

The present invention relates to a semiconductor device which has a circuit composed of a thin film transistor (hereinafter referred to as TFT), and to a method of manufacturing the semiconductor device. For instance, the present invention relates to an electro-optical device represented by a liquid crystal display panel, and to electronic equipment which has such electro-optical device as its component.

In this specification, the term semiconductor device refers to a device in general that utilizes semiconductor characteristics to function, and electro-optical devices, light emitting devices, semiconductor circuits, and electronic equipment are all semiconductor devices.

2. Description of the Related Art

In recent years, development of a semiconductor device has been advanced, which has a large area integrated circuit composed of a thin film transistor (TFT) that is formed from a semiconductor thin film (several nm to several hundreds nm in thickness) on a substrate with an insulating surface. Typical examples of the semiconductor device include a liquid crystal display device with a liquid crystal module, an EL module, and a non-magnification image sensor.

Of liquid crystal display devices, one that is attracting attention is an active matrix liquid crystal display device in which pixel electrodes are arranged so as to form a matrix and TFTs are used for switching elements that are respectively connected to the pixel electrodes in order to obtain a high quality image.

In a liquid crystal module to be mounted to a liquid crystal display device, a pixel portion for displaying an image and a driving circuit for controlling the pixel portion are formed in different functional blocks on the same substrate. The driving circuit is based on a CMOS circuit and includes a shift register circuit, a level shifter circuit, a buffer circuit, a sampling circuit, and the like.

The pixel portion of the liquid crystal module has several ten thousands to several millions of pixels and each of the pixels is provided with a TFT (pixel TFT). A pixel electrode is provided for each pixel TFT. An opposite electrode is formed on an opposite substrate that faces the substrate which has the pixel portion and driving circuit across the liquid crystal. A kind of capacitor is formed with the liquid crystal as dielectric. The voltage applied to each pixel is controlled by switching function of the TFT, and electric charges given to the capacitor are controlled to drive the liquid crystal and control the amount of light transmitted for displaying an image.

Conventionally, a TFT is formed from an amorphous silicon film. In order to achieve higher performance, it has been attempted to use a crystalline silicon film (typically called a polysilicon film) for an active layer of a TFT (hereinafter referred to as polysilicon TFT). A polysilicon TFT is high in field effect mobility and therefore can make a circuit which has various functions.

A technique for employing such crystalline silicon film over a glass substrate is disclosed in Japanese Patent Application Laid-open No. Hei 8-78329. According to the technique described in the publication, an amorphous silicon film is selectively doped with a metal element that accelerates crystallization (typically nickel) and then subjected to heat treatment to grow a crystalline silicon film from the doped region. Crystal grains obtained by this technique are very large in size.

Owing to the effect of the metal element, the technique is capable of lowering the temperature, at which the amorphous silicon film is crystallized, by 50 to 100° C. as compared to the case where the metal element is not used in crystallization. In addition, time required to complete crystallization is ⅕ to ⅒ of the case where the metal element is not used for crystallization. This technique is superior also in terms of productivity.

The crystalline silicon film obtained in accordance with the technique of the above publication (Japanese Patent Application Laid-open No. Hei 8-78329) has a unique crystal structure. A large number of columnar crystal masses (also called domains) are formed in the crystal silicon film and crystals in one crystal mass (domain) all have the same crystal orientation. The size of one crystal mass (domain) is as large as 200 to 300 µm. Adjacent crystal masses (domains) have different orientations and there is a boundary between adjacent crystal masses. When a TFT is formed so that its channel formation region is confined within one crystal mass, it is expected that almost the same level of electric characteristics as those of single crystal are obtained. However, with the technique of the above publication, crystal masses are formed at random and it is difficult to manufacture a TFT with its channel formation region placed within one of the randomly-formed crystal masses. Accordingly, it is also difficult to form a channel formation region of every TFT in the pixel portion within one crystal mass.

When a crystalline silicon film obtained by the technique of the above publication is used for an active layer of a TFT, the TFT is advantageous in excellent electric characteristics. On the other hand, there is a slight difference, namely, fluctuation, in TFT characteristics between TFTs obtained by the technique due to the presence or absence of a boundary between adjacent crystal masses (between crystal masses with different orientations), or due to varying sizes of crystal masses formed.

If there is a fluctuation in electric characteristics among the TFTs placed in the pixel portion, voltages applied to the respective pixel electrodes are fluctuated and the amount of light transmitted is then fluctuated, to result in uneven display to the eyes of an observer. Although the fluctuation is in an acceptable range and does not cause a problem at present, it is conceivable that the fluctuation is a very serious problem as the pixel size is more minute to obtain an image with higher definition in future.

With the reduction in size of a channel formation region (channel length and channel width) as wall as the upcoming reduction in the width of a wiring line, it is unavoidable that a TFT has its channel formation region at a boundary between crystal masses. TFT characteristics (the mobility, S value, ON current value, and OFF current value, and the like) of the TFT is different from TFT characteristics of TFTs whose channel formation regions are not formed in boundaries, which is considered as a cause of display fluctuation.

Despite several attempts, there have not been found the optimum measure to form a crystalline silicon film which has a uniform grain size at a process temperature equal to or lower than the distortion point of glass substrate, namely, 600° C.

It is difficult to obtain a highly uniform crystalline silicon film and high mobility at the same time in prior art. It is also difficult to manufacture a TFT at a process temperature equal to or lower than 600° C. in prior art.

An active matrix type light emitting device which has an OLED as a self-luminous element (hereinafter simply referred to as light emitting device) is being researched actively. A light emitting device is also called as an organic EL display (OELD) or an organic light emitting diode (OLED).

An OLED, which is self-luminous, does not need back light which is necessary in liquid crystal display devices (LCDs) and is therefore suitable for making a thinner device. In addition, a self-luminous OLED has high visibility and no limitation in terms of viewing angle. These are the reasons why light emitting devices using OLEDs are attracting attention as display devices that replace CRTs and LCDs.

Known as one mode of light emitting devices using OLEDs is an active matrix driving method in which each of pixels has a plurality of TFTs and video signals are sequentially written in the pixels to display an image. In the light emitting device using OLEDs, a TFT is an indispensable element when the active matrix driving method is employed. However, TFTs formed from polysilicon easily fluctuate in characteristics due to defects in grain boundaries.

In light emitting devices using OLEDs, each pixel is provided with at least a TFT for functioning as a switching element and a TFT for supplying current to an OLED. Irrespective of circuit structures and driving methods of pixels, the luminance of a pixel is determined by the ON current ($I_{on}$) of a TFT electrically connected to an OLED to supply a current to the OLED. Therefore, when the entire screen displays white, for example, the luminance is fluctuated unless the ON current of each pixel is constant.

SUMMARY OF THE INVENTION

In order to solve the above problems, numerous experiments and examinations have been conducted in view of various angles. As a result, it has been found that crystal masses in a crystalline silicon film can have a uniform size by doping the top face of an amorphous silicon film to be crystallized with a metal element that accelerates crystallization, irradiating the film with laser light (light from a pulse oscillation laser with an energy density of 50 to 150 mJ/cm$^2$) from the back side of a light-transmissive substrate, and then subjecting the film to heat treatment. Thus, the above problems, especially the fluctuation between TFTs, are solved to complete the present invention.

Laser light in the present invention is characterized by having an energy density which does not melt an amorphous silicon film and by being capable of increasing crystal nuclei in number. There is no change in appearance before and after irradiating the laser light and no ridges are formed on the surface of the silicon film after irradiating the laser light. In short, the energy of laser light in the present invention is not large enough to melt an amorphous silicon film, is not large enough to change the surface state of the film, and is large enough to allow the metal element to move in the solid semiconductor film.

An object of the present invention is to provide measures for obtaining a TFT with its channel formation region which has a plurality of uniform crystal masses in size. The present invention can provide a semiconductor device which has very little fluctuation in TFT characteristics, and can prevent the fluctuation from being a problem when display with higher definition is demanded in future.

Furthermore, the present invention is capable of controlling the grain size by adjusting the energy density of laser light before the heat treatment. Accordingly, the size of a crystal mass can be appropriately adjusted to suit the pixel size or the size of a channel formation region. Thus, the present invention prevents the fluctuation from being a problem when the channel formation region becomes more minute in size in future.

Moreover, time required to complete crystallization can be shortened by the measures of the present invention if the temperature of the heat treatment is the same as that in the technique described in the publication above.

According to the measures of the present invention, crystallization can be achieved with a smaller dose of metal element than that in the technique described in the above publication even when the temperature and time of the heat treatment are the same as those in the technique described in the publication above. The metal element for accelerating crystallization is desirably removed by a gettering technique or the like after crystallization and therefore crystallization with a smaller dose of metal element is better. As the thickness of an amorphous silicon film to be crystallized is increased, the time of the heat treatment has to be prolonged, the temperature of the heat treatment has to be set higher, or a larger dose of metal element is required for sufficient crystallization in prior art. On the other hand, the present invention can achieve crystallization without changing heat treatment conditions even when the thickness of an amorphous semiconductor film to be crystallized is increased. In short, the present invention can crystallize a larger area of amorphous semiconductor film in a shorter time than prior art.

It is possible to irradiate the laser light selectively before the heat treatment. Therefore, only a portion in which fluctuation in TFT characteristics matters, the pixel portion, for example, is irradiated with laser light while the driving circuit portion is not irradiated with laser light. Alternatively, the pixel portion and a part of the driving circuit portion may be irradiated with laser light since the driving circuit portion also has a portion in which fluctuation in TFT characteristics matters, as an analog switch circuit, for example. The present invention is particularly effective in a circuit which has a channel formation region with a large size, and it is possible to place two or more crystal masses (domains) in the channel formation region in the channel length direction.

The present invention disclosed in this specification relates to a method of manufacturing a semiconductor device, including: a first step of forming a semiconductor film with an amorphous structure on a substrate with an insulating surface; a second step of adding a metal element to the semiconductor film with an amorphous structure; a third step of irradiating light to the semiconductor film with an amorphous structure from the back side of the substrate through the substrate; and a fourth step of forming a semiconductor film with a crystal structure by heating the semiconductor film with an amorphous structure.

The present invention also relates to another method of manufacturing a semiconductor device, including: a first step of forming a semiconductor film with an amorphous structure on a substrate with an uneven insulating surface; a second step of adding a metal element to the semiconductor film with an amorphous structure; a third step of irradiating light to the semiconductor film with an amorphous structure from the back side of the substrate through the substrate; and a fourth step of forming a semiconductor film with a crystal structure by heating the semiconductor film with an amorphous structure.

The uneven insulating surface in the above refers to a surface of an insulating film (such as a gate insulating film or an interlayer insulating film) formed so as to cover an electrode (such as a gate electrode) on a substrate, or a surface of a base insulating film formed on a substrate, or a surface of an insulating substrate.

The above manufacturing methods are characterized in that crystal masses in the semiconductor film with a crystal structure are substantially uniform in size, and are also characterized in that sizes of crystal masses in the semiconductor film with a crystal structure are approximately 1 to 20 μm.

The above manufacturing methods are characterized in that the light is pulse oscillation laser light which has an energy density of 50 to 150 mJ/cm$^2$. The present invention can employ a continuous wave laser other than a pulse oscillation laser. The light is emitted from one or more kinds of lasers selected from the group consisting of a pulse oscillation excimer laser, a pulse oscillation Ar laser, a pulse oscillation Kr laser, a continuous wave excimer laser, a continuous wave Ar laser, and a continuous wave Kr laser.

Further, it is needless to say that it is possible to use a light emitted from one or more kinds of lasers selected from the group consisting of a continuous wave YAG laser, a continuous wave YVO$_4$ laser, a continuous wave YLF laser, a continuous wave YAlO$_3$ laser, a continuous wave glass laser, a continuous wave ruby laser, a continuous wave alexandrite laser, a continuous wave Ti: sapphire laser, a pulse oscillation YAG laser, a pulse oscillation YVO$_4$ laser, a pulse oscillation YLF laser, a pulse oscillation YAlO$_3$ laser, a pulse oscillation glass laser, a pulse oscillation ruby laser, a pulse oscillation alexandrite laser, and a pulse oscillation Ti: sapphire laser.

When a continuous wave laser is used, it is important for the laser light to have an energy density which does not melt the semiconductor film. When the energy density is set to 0.01 to 100 MW/cm$^2$ (preferably 0.1 to 10 MW/cm$^2$) and the scanning rate is set to 0.5 to 2000 cm/sec., the metal element is uniformly diffused throughout the semiconductor film to increase crystal nuclei in number while the semiconductor film is kept in its solid.

The above manufacturing methods are characterized in that the metal element is one that accelerates crystallization. In this specification, a metal element that accelerates crystallization is one or more kinds of elements selected from the group consisting of Fe, Ni, Co, Ru, Rh, Pd, Os, Ir, Pt, Cu, and Au.

Also, the laser light may be irradiated before crystallization at the energy which is not large enough to melt the semiconductor film and not large enough to change the surface state. The present invention relates to another method of manufacturing a semiconductor device, including: a first step of forming a semiconductor film with an amorphous structure on a substrate with an insulating surface; a second step of irradiating the front side or back side of the semiconductor film with an amorphous structure by using light with an energy which is not large enough to melt the semiconductor film; and a third step of forming a semiconductor film with a crystal structure by crystallizing the semiconductor film with an amorphous structure.

In the above method of manufacturing a semiconductor device, the third step may be a step of irradiating laser light (light with an energy which is large enough to melt the semiconductor film) to the semiconductor film with an amorphous structure, or a step of heating the semiconductor film with an amorphous structure, or a step of heating the semiconductor film with an amorphous structure after doping the amorphous semiconductor film with a metal element that accelerates crystallization.

As has been described, it makes an impurity contained in the semiconductor film (an element which has a high diffusion constant or a high degree of solid solution in the semiconductor film, hydrogen, for example) diffuse in the solid film for performing improved crystallization later to irradiate laser light with an energy which is not large enough to melt a semiconductor film with an amorphous structure before crystallization. When a semiconductor film with a uniform amorphous structure, obtained by irradiating laser light with an energy which is not large enough to melt the semiconductor film, is crystallized, a semiconductor film with a uniform crystal structure can be obtained. Accordingly, TFTs using as their active layers this semiconductor film with a crystal structure are uniform in characteristics to reduce uneven display and fluctuation in luminance.

Also, irradiation of laser light may selectively be performed. The present invention relates to another method of manufacturing a semiconductor device which has a pixel portion and a driving circuit on the same substrate, including: a first step of forming a semiconductor film with an amorphous structure on a substrate with an insulating surface; a second step of selectively irradiating only a region of the semiconductor film with an amorphous structure that serves as the pixel portion with light with an energy which is not large enough to melt the semiconductor film; and a third step of forming a semiconductor film with a crystal structure by heating the semiconductor film with an amorphous structure.

The semiconductor device obtained by the above manufacturing methods has characteristics uniquely provided by the present invention. In the present invention, there is provided a semiconductor device which has a first region comprising a first TFT and a second region comprising a second TFT on the same substrate, in which the first TFT uses as its active layer a semiconductor film with a crystal structure, sizes of crystal grains are smaller in the first TFT than in the second TFT, and sizes of crystal grains are less fluctuated in the first region than in the second region.

Selective irradiation of laser light (with energy which is not large enough to melt a semiconductor film) makes it possible to form different TFTs so as to suit different circuits. For instance, regions for forming TFTs used for a circuit in which the fluctuation matters, such as a pixel TFT used as a switching element and a TFT of an analog switch circuit, are irradiated with laser light (with energy which is not large enough to melt a semiconductor film) whereas regions for forming TFTs used for a circuit in which an increase in ON current matters more than reduced fluctuation, such as a TFT of a buffer circuit, are not irradiated with the laser light. Then, crystallization is performed through heat treatment to selectively form regions where crystal grains are small and the fluctuation is small (regions irradiated with the laser light) and regions where crystal grains are large (regions that are not irradiated with light).

The above structure is characterized in that the first region is a pixel portion and the second region is a driving circuit. If a display unit has a pixel TFT in which there is the fluctuation in size is small between crystal grains, it is possible to complete a display device (typically a liquid crystal display device or a display device with an OLED) which is free from uneven display using the display unit.

In this specification, an electrode is a part of a wiring line and refers to a point at which one wiring line is electrically connected to another wiring line, or a point at which a wiring line intersects a semiconductor layer. Although he terms "wiring line" and "electrode" are distinguished from each other for the sake of explanation, "electrode" always implies "wiring line".

An organic light emitting layer is defined in this specification as an aggregate of layers formed between an anode and cathode of an OLED. Specifically, an organic light emitting layer includes a light emitting layer, a hole injecting layer, an electron injecting layer, a hole transporting layer, an electron transporting layer, etc. The basic structure of OLED is a laminate of an anode, a light emitting layer, and a cathode layered in order. The basic structure may be modified into a laminate of an anode, a hole injecting layer, a light emitting layer, and a cathode layered in order, or a laminate of an anode, a hole injecting layer, a light emitting layer, an electron transporting layer, and a cathode layered in order.

An OLED has, in addition to an anode and a cathode, a layer containing an organic compound (organic light emitting material) that generates luminescence (electro luminescence) when an electric field is applied (the layer is hereinafter referred to as organic light emitting layer). Luminescence obtained from organic compounds is classified into light emission in returning to the base state from singlet excitation (fluorescence) and light emission in returning to the base state from triplet excitation (phosphorescence). A light emitting device of the present invention may use one or both of the above two types of light emission.

BRIEF DESCRIPTION OF THE DRAWINGS

In the accompanying drawings:

FIGS. 4A to 4G are diagrams showing a manufacturing process of the present invention (Embodiment 1);

DETAILED DESCRIPTION OF THE PREFERRED EMBODIMENTS

Embodiment Mode

Figure 1:
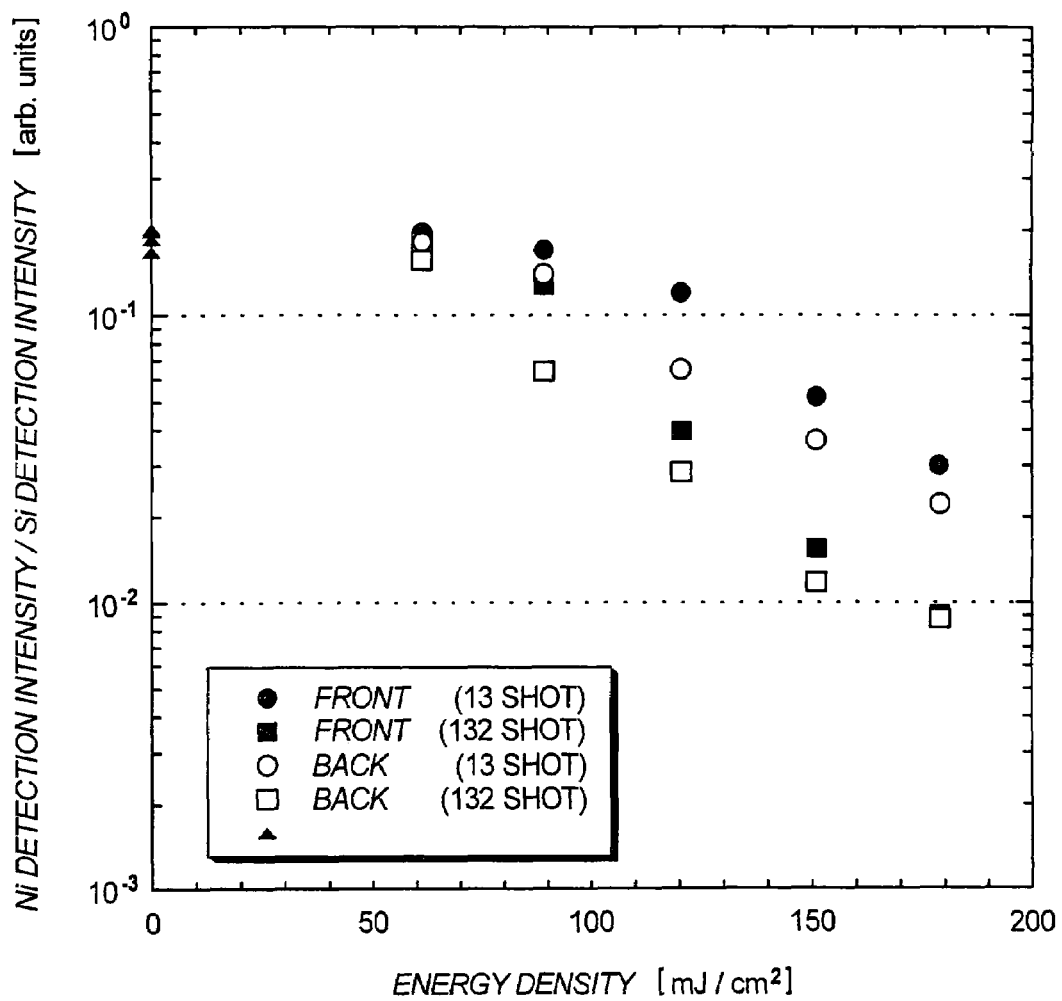
FIG. 1 is a graph showing results of TXRF performed on a silicon surface after laser light irradiation.

An embodiment mode of the present invention will be described below.

The present invention includes a first step of doping a surface of an amorphous semiconductor film with a metal element, a second step of irradiating laser light (an energy density of 50 to 150 mJ/cm$^2$) from the back side, and a third step of performing a heat treatment for crystallization. Through the three steps, the present invention obtains a crystalline semiconductor film which has uniform crystal masses and controls sizes of the crystal masses in the crystalline semiconductor film.

The amorphous semiconductor film can be formed by reduced pressure thermal CVD, plasma CVD, sputtering, or the like from a semiconductor material, for example, silicon or a silicon germanium ($Si_xGe_{1-x}$(X=0.0001 to 0.02) alloy.

The doped metal element before crystallization in order to accelerate crystallization is desirably removed from or reduced in the crystalline semiconductor film by gettering after the crystallization. Doping of the metal element that accelerates crystallization can be achieved by application of a solution containing the metal element, or by forming a thin film through sputtering or CVD. One employable gettering method includes the steps of forming an oxide film on the crystalline silicon film; forming an amorphous silicon film containing noble gas (typically argon) as a gettering site on the oxide film to form a laminate; and performing a heat treatment to move the metal element (typically nickel) in the crystalline silicon film to the gettering site and remove the metal element from the crystalline silicon film, or reduce the concentration of the metal element in the crystalline silicon film. Another employable gettering method includes the steps of doping a part of the crystalline silicon film with phosphorus or noble gas to form a gettering site; and perform a heat treatment to move the metal element (typically nickel) from the gettered region to the gettering site.

The laser light is obtained from gas laser or solid laser. Examples of gas laser include an excimer laser, an Ar laser, and a Kr laser. Examples of solid laser include a YAG laser, a YVO$_4$ laser, a YLF laser, a YAlO$_3$ laser, a glass laser, a ruby laser, an alexandrite laser, and a Ti: sapphire laser. A solid laser employed uses a crystal of YAG, YVO$_4$, YLF, or YAlO$_3$ doped with. Cr, Nd, Er, Ho, Ce, Co, Ti, or Tm. The fundamental wave of light emitted from the laser varies in accordance with the dopant and has a wavelength of about 1 µm. Harmonic is obtained from the fundamental wave by using a non-linear optical element. Particularly preferred are the second harmonic or third harmonic of a pulse oscillation excimer laser, continuous wave excimer laser, the second harmonic or the third harmonic of continuous wave YAG laser, or the second harmonic of a YVO$_4$ laser. The shape of the laser light to be irradiated may be linear, rectangular, or elliptical.

The description below deals with a case where pulse oscillation laser light (an energy density of 50 to 150 mJ/cm$^2$) is employed. However, it is needless to say that continuous wave laser light can be used instead.

According to the present invention, a crystalline semiconductor film in which crystal masses have the uniform size can be obtained, a channel formation region can have a plurality of crystal masses (a plurality of domains) wherever it is positioned, and a boundary between crystal masses is scattered evenly in the channel formation region. Therefore, the present invention can provide uniform electric characteristics.

The present invention is also capable of shortening time required for crystallization since a large number of crystal nuclei are formed by irradiation of laser light (an energy density of 50 to 150 mJ/cm$^2$) from the back side and then heat treatment follows to further increase the number of crystal nuclei and complete crystallization. In addition, the present invention can achieve crystallization in a short period of time even when a temperature in the heat treatment is lower than in prior art. Furthermore, the present invention can crystallize a thick semiconductor film, for example, an amorphous silicon film with a thickness of 80 nm or more, without increasing the dose of the metal element that accelerates crystallization.

An observation through a microscope after irradiating the laser light from the back side finds no particular changes compared the state before irradiating the laser light. The laser light (an energy density of 50 to 150 mJ/cm$^2$) is very weak as compared to the intensity of laser light used in crystallization (an energy density of 200 to 250 mJ/cm$^2$, or more). At the energy density of the laser light in the present invention, the semiconductor film is not melted and no ridges are formed. When irradiation of this weak laser light with a small energy density is followed by heat treatment for crystallization, a large number of crystal masses with a uniform size can be formed.

To unravel the mechanism of forming crystal masses with uniform size, the following experiments have been conducted.

Experiment 1

First, a silicon oxide film with a thickness of 280 nm and an amorphous silicon film with a thickness of 69 nm are formed by reduced pressure thermal CVD and layered on a quartz substrate and a nickel acetate aqueous solution (5 ppm) is applied thereto to prepare a sample. While laser light conditions are varied (including the energy density and the number of shots), samples are irradiated with laser light. Then, the nickel detection intensity and the silicon detection intensity on the surfaces are measured by TXRF (total reflection X-ray fluorescence) to calculate the ratio of the nickel detection intensity to the silicon detection intensity. Experiment 1 is an experiment for examining the presence or absence of a change in nickel concentration immediately after irradiating the laser light.

FIG. 1 shows the results of Experiment 1. In FIG. 1, samples irradiated with excimer laser light (energy density: 60 mJ/cm$^2$, 90 mJ/cm$^2$, 120 mJ/cm$^2$, 150 mJ/cm$^2$, 180 mJ/cm$^2$) of 132 shots from the back side of the substrate are plotted and indicated by □. Samples irradiated with excimer laser light (energy density: 60 mJ/cm$^2$, 90 mJ/cm$^2$, 120 mJ/cm$^2$, 150 mJ/cm$^2$, 180 mJ/cm$^2$) of 13 shots from the back side of the substrate are plotted and indicated by ○. For comparison, samples irradiated with excimer laser light (energy density: 60 mJ/cm$^2$, 90 mJ/cm$^2$, 120 mJ/cm$^2$, 150 mJ/cm$^2$, 180 mJ/cm$^2$) of 132 shots from the front side of the substrate are plotted and indicated by ■, and samples irradiated with excimer laser light (energy density: 60 mJ/cm$^2$, 90 mJ/cm$^2$, 120 mJ/cm$^2$, 150 mJ/cm$^2$, 180 mJ/cm$^2$) of 13 shots from the front side of the substrate are plotted and indicated by ●. Other comparative samples that are not irradiated with laser light are plotted and indicated by ▲.

Experiment 2

The samples irradiated with laser light from the back side in Experiment 1 are subjected to heat treatment (heat treatment at 450° C. for an hour which is followed by heat treatment at 600° C. for twelve hours) for crystallization. The samples are then observed through an optical microscope to measure sizes of crystal masses. Experiment 2 is an experiment for examining the relation between the size of the crystal mass and the energy density in the case where irradiation of laser light from the back side precedes heat treatment for crystallization.

Figure 2:
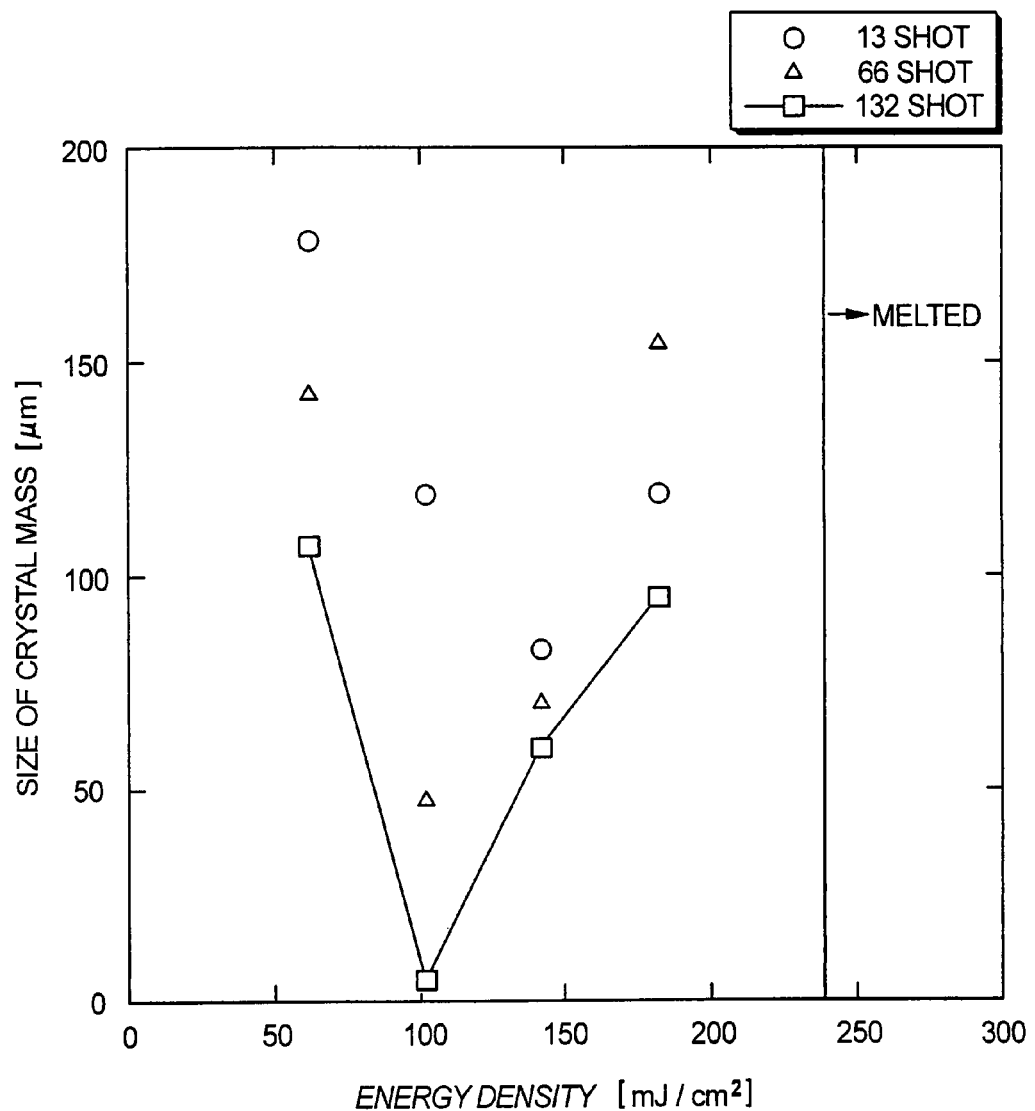
FIG. 2 is a graph showing the relation between the energy density of laser light irradiated from the back side and the size of crystal mass.

FIG. 2 shows the results of Experiment 2. In FIG. 2, samples irradiated with excimer laser light (energy density: 60 mJ/cm$^2$, 90 mJ/cm$^2$, 120 mJ/cm$^2$, 150 mJ/cm$^2$, 180 mJ/cm$^2$) of 132 shots from the back side of the substrate are plotted and indicated by □. Samples irradiated with excimer laser light (energy density: 60 mJ/cm$^2$, 90 mJ/cm$^2$, 120 mJ/cm$^2$, 150 mJ/cm$^2$, 180 mJ/cm$^2$) of 13 shots from the back side of the substrate are plotted and indicated by ○. Samples irradiated with excimer laser light (energy density: 60 mJ/cm$^2$, 90 mJ/cm$^2$, 120 mJ/cm$^2$, 150 mJ/cm$^2$, 180 mJ/cm$^2$) of 66 shots from the back side of the substrate are plotted and indicated by △.

Figure 3:
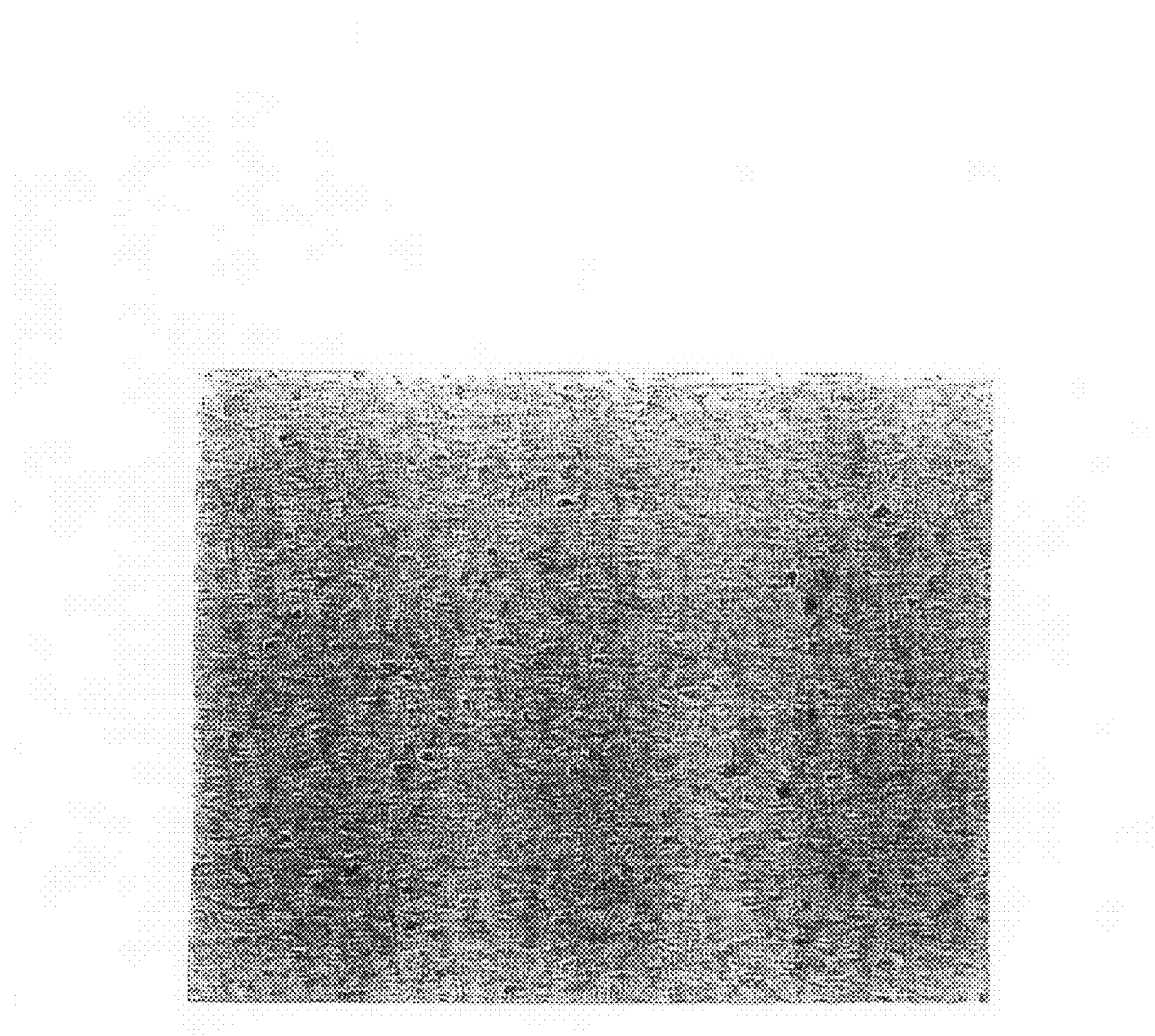
FIG. 3 is a picture observing a surface of a silicon film of the present invention (magnification: ×100)

From these experiment results, the present inventors have concluded that the mechanism for forming crystal masses with an uniform size is as follows:

In the laser irradiation, photo reaction brought by the laser light severs Si—Si lattice bond, which is substituted for a metal (nickel) to accelerate silicide (NiSi$_x$) reaction. In other words, nickel is diffused in the film by the laser irradiation to form silicides (NiSi$_x$). FIG. 1 shows that nickel on the surface is reduced in amount as laser light with an energy density of 60 mJ/cm$^2$ or more makes nickel diffuse in the film. That is, the laser irradiation makes nickel move and diffuse in the solid silicon film. More silicides (NiSi$_x$) are formed in the subsequent heat treatment. The thus formed silicides serve as crystal nuclei to advance crystallization. As the number of the crystal nuclei are increased, crystal grains and crystal masses are reduced in size. In this way, the present invention makes the size of the crystal mass uniform by increasing the number of crystal nuclei. In FIG. 2, the smallest size of the crystal mass, about 5 μm, is obtained under the condition of light with an energy density of 90 mJ/cm$^2$ in 132 shots. A picture of the sample observed through an optical microscope is shown in FIG. 3.

It is another method for increasing the number of crystal nuclei to dope the semiconductor film with a large amount of metal element that accelerates crystallization, and the surface energy and chemical potential of the semiconductor film are changed. Although this method does increase the number of crystal nuclei, it has a problem of the metal element remaining as metal compounds in an excessive amount in a high resistance region (such as a channel formation region and an offset region). It is easy that a current flows in the metal compounds, and therefore the metal compounds lower the resistance of the region that is supposed to be a high resistance region and impair stability of TFT electric characteristics as well as reliability.

Figure 15:
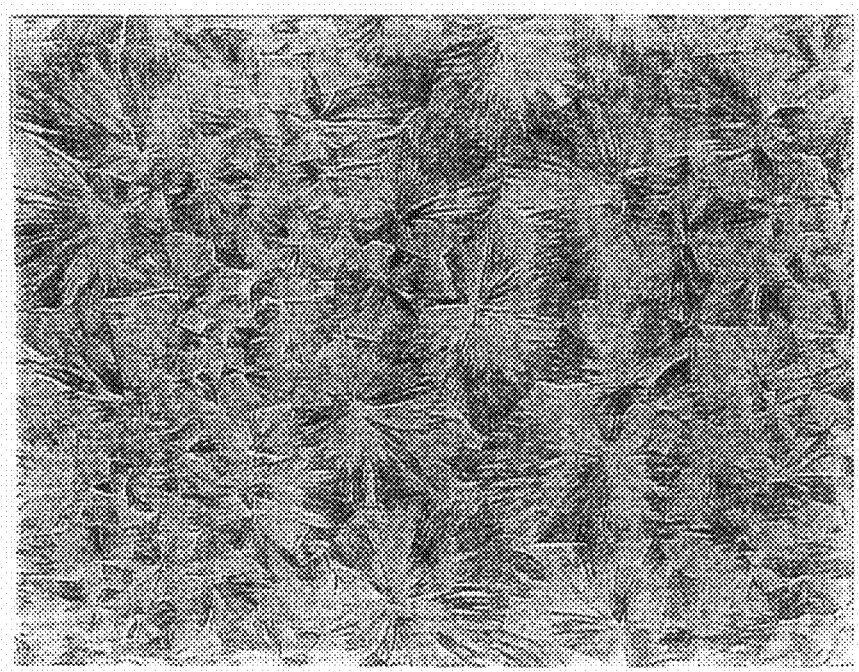
FIG. 15 is a picture observing a surface of a silicon film of a comparative sample (magnification: ×100)

In the case where the semiconductor film is crystallized by performing only heat treatment after doping a metal element without laser irradiation from the back side, the number of crystal masses is small and sizes of crystal masses range between 200 μm and 300 μm. The sample crystallized by performing only heat treatment is observed through an optical microscope and a picture thereof is shown in FIG. 15.

In the case where the semiconductor film is crystallized by performing heat treatment after laser irradiation under the same conditions except irradiating laser light from the front side, crystal masses are smaller in size than the case where the semiconductor film is crystallized by performing only heat treatment. However, the size of the crystal mass in this case is larger than 5 μm and widely varies unlike the case where the semiconductor film is irradiated with laser light from the back side. Since the energy density received by the semiconductor film itself in the case of irradiating from the back side is different from that in the case of irradiating from the front side, the energy density is converted to set the effective energy density in the case of irradiating from the back side equal to the effective energy density in the case of irradiating from the front side. Still, the size of the crystal mass in the case of irradiating from the front side is larger than 5 μm and widely varies unlike the case of irradiating from the back side. From these facts, it is inferred that the key for forming crystal masses with uniform size is irradiation of the semiconductor film with laser light from the back side, not the laser energy density.

When a semiconductor film is crystallized using a metal element that accelerates crystallization, crystal grains grown from crystal nuclei formed due to the metal element are mixed with crystal grains grown from natural nuclei (natural nuclei defined in this specification are crystal nuclei except those formed due to a metal element) to cause fluctuation in physical property of the semiconductor film. It is known that natural nuclei are generated when the temperature is 600° C. or higher or when it takes long for the semiconductor film to crystallize. Such fluctuation causes fluctuation in electric characteristics and uneven display when the semiconductor film is used in a display unit of a semiconductor device.

The present invention prevents natural nuclei from being generated and controls the number of crystal nuclei to obtain uniform crystal masses and control sizes of the crystal masses. Although he size of the crystal mass in the present invention is 1 to 20 μm, it is not particularly limited. The appropriate size of the crystal mass varies between one type of TFT from another and it should be set in accordance with the type of TFT. In the present invention, the size of the crystal mass can be set freely by adjusting laser light the energy density and the number of shots. In short, the present invention can control the size of the crystal mass freely within a range between 1 μm and 20 μm and can provide a semiconductor film with uniform characteristics. Accordingly, TFTs which have as active layers semiconductor films with uniform characteristics can have uniform electric characteristics.

In the present invention, irradiation of laser light before crystallization does not form a ridge on the surface of the semiconductor film since the semiconductor film is crystallized by heat treatment in a furnace. In conventional crystallization by laser light, growing crystals collide with each other and form ridges to make the surface of the semiconductor layer uneven and lower the OFF current value. Furthermore, in conventional crystallization by laser light, crystal nuclei are formed at random during a cooling period after the laser irradiation, and crystals grow in various directions to form minute crystal grains with various grain sizes and a large number of crystal defects. Moreover, conventional crystallization by laser light fails to give a uniform energy to the entire film and leaves wave-like tracks after irradiating laser light. In contrast to prior art, the present invention employs heat treatment for crystallization and is capable of giving a uniform energy to the entire film.

In conventional solid phase growth by annealing at high temperature, crystals grow from natural nuclei and the natural nuclei are generated at random. On the other hand, the present invention can control the generation of crystal nuclei by doping an amorphous semiconductor film with a metal element and then irradiating laser light (with energy which is not large enough to melt the semiconductor film and which is large enough to allow the metal element to diffuse in the solid semiconductor film) from the back side.

In conventional crystallization methods (laser crystallization and solid phase growth), crystals formed in a plane have various grain sizes. The grain size may be locally small and does not exceed 1 μm throughout the semiconductor film.

Another experiment has been conducted, in which an insulating film is formed to cover a wiring line, the insulating film which has an uneven surface due to the wiring line is covered with an amorphous semiconductor film, and the amorphous semiconductor film is doped with a metal element, irradiated with laser light from the back side, and then subjected to heat treatment. As a result, uniform crystal grains are obtained despite the uneven surface. This experimental result shows that crystal nuclei generated by the metal element and by laser light from the back side dominate in growing crystals although unevenness can cause generation of crystal nuclei. Therefore, according to the present invention, uniform crystal grains can be obtained in spite of unevenness of the substrate and can also be obtained when a wiring line is placed under the semiconductor film.

The present invention is very effective not only in a top gate TFT but also in a bottom gate TFT. In a bottom gate TFT, an amorphous silicon film formed on an insulating film that covers a gate electrode is crystallized. The amorphous silicon film is crystallized to greatly different degrees in a region that overlaps the gate electrode and a region that does not overlap the gate electrode in prior art. The present invention can uniformly crystallize the entire amorphous silicon film formed on an insulating film that covers the gate electrode.

The number of crystal nuclei may be increased even more before crystallization by exposing the amorphous silicon film to an atmosphere of plasmatized gas that mainly contains one or more kinds selected from a noble gas element, nitrogen, and ammonium.

A pulse oscillation excimer laser is used in the experiments described above. However, similar results can be obtained when a continuous wave laser is used as long as the energy of laser light is properly adjusted so as not to melt the semiconductor film.

The present invention with the above structure will further be described in detail through the following embodiments.

Embodiment 1

Embodiment 1 describes an example of manufacturing a TFT from an amorphous semiconductor film obtained by reduced pressure thermal CVD on a quartz substrate (1.1 mm in thickness). The description is given with reference to FIGS. 4A to 4G First, an amorphous silicon film 101 with a thickness of 50 nm and a silicon oxide film 102 with a thickness of 50 nm are formed on each side of a quartz substrate 100 by reduced pressure thermal CVD (FIG. 4A).

A resist film 103 is formed next in order to remove the amorphous silicon film and silicon oxide film formed on the back side of the substrate. The silicon oxide film on the back side is removed by a solution containing fluoric acid, and the amorphous silicon film on the back side is removed by a mixture gas of $SF_6$ and He (FIG. 4A).

Next, the resist film 103 is removed and the silicon oxide film 102 on the front side is removed. After washing the substrate with diluted fluoric acid, an oxide film (not shown) is formed by using ozone water on the surface of the amorphous silicon film. A solution containing nickel (5 ppm) is applied by spin coating to form a thin metal film 104 (FIG. 4C). Here, nickel is used as a metal element that accelerates crystallization. Nickel is a metal element which is very high in diffusion constant and degree of solid solution in a silicon film, and therefore is suitable for the present invention.

Then, linear laser light is irradiated from the back side of the substrate (FIG. 4D). An excimer laser (XeCl: 308 nm) is employed here. Conditions in irradiating the laser light include the energy density of 50 to 150 mJ/cm$^2$, the frequency of 30 Hz, the number of shots of 66 to 132, and the scanning rate of 0.1 mm/sec. When the frequency is set higher than 30 Hz, the scanning rate can be set exceed 0.1 mm/sec. Here, the energy density is set to 100 mJ/cm$^2$, the frequency to 30 Hz, the number of shots to 132, and the scanning rate to 0.1 mm/sec. for irradiating the laser light. Crystal nuclei are generated through this laser light. However, the laser light is irradiated for increasing the number of crystal nuclei and most part of the semiconductor film remains amorphous. The semiconductor film at this point is a semiconductor film 105 with an amorphous structure in which the density of crystal nuclei is higher than in the semiconductor film 101 with an amorphous structure. FIG. 1 shows results of measuring the surface of the semiconductor film at this stage by TXRF. From FIG. 1, it can be read that the laser light with an energy density which is not large enough to melt the silicon film makes nickel on the surface to diffuse into the film to form suicides that serve as crystal nuclei.

Next, the semiconductor film is crystallized by heat treatment to form a semiconductor film 106 with a crystal structure (FIG. 4E). Here, heat treatment at 450° C. for an hour is followed by heat treatment at 600° C. for twelve hours. The thus obtained semiconductor film 106 with a crystal structure has relatively large crystal masses in size, about 5 μm, and the crystal masses are uniform throughout the film. The semiconductor film at this stage is subjected to etching and a picture of the surface observed through an optical microscope is shown in FIG. 3.

The size of the crystal mass can be set suitably by adjusting laser in the energy density, the number of shots (overlap ratio), and scanning rate.

Next, the obtained semiconductor film 106 with a crystal structure is patterned to form a semiconductor layer 107 (FIG. 4F).

After washing the surface of the semiconductor layer with an etchant containing fluoric acid, an insulating film mainly containing silicon is formed to serve as a gate insulating film 108. The surface washing and formation of the gate insulating film are desirably carried out in succession without exposing the substrate to the air.

The surface of the gate insulating film is washed and then a gate electrode 109 is formed. The semiconductor layer is doped with an impurity element that gives a semiconductor the n-type conductivity (such as P or As), here, phosphorus, to form a source region 110 and a drain region 111. After the doping, the impurity element is activated by heat treatment, irradiation of intense light, or irradiation of laser light. The impurity element is activated, and at the same time, plasma damage to the gate insulating film and plasma damage to the interface between the gate insulating film and the semiconductor layer can be repaired. It is particularly effective to activate the impurity element by irradiating the second harmonic of a YAG laser from the front side or back side in an atmosphere at room temperature to 300° C. A YAG laser which requires little maintenance is preferable measures for activation.

When heat treatment is employed as activation measures, activation and gettering can be achieved simultaneously. Gettering here utilizes phosphorus doped in the source region or drain region. The metal element that accelerates crystal growth, doped before crystallization, is desirably removed from or reduced in the crystalline semiconductor film through gettering after the crystallization.

The subsequent steps include forming an interlayer insulating film 113, hydrogenating the semiconductor layer, forming contact holes that reach the source region and the drain region, and forming a source electrode 114 and a drain electrode 115. A TFT is thus completed (FIG. 4G).

Although the thus obtained TFT has a plurality of grain boundaries in a channel formation region 112, highly uniform crystal masses are obtained. There is little fluctuation between TFTs formed on the substrate.

The present invention is not limited to the structure of FIGS. 4A to 4G. If necessary, the present invention can take a lightly doped drain (LDD) structure in which an LDD region is formed between a channel formation region and a drain region (or a source region). In the LDD structure, a region lightly doped with an impurity element (LDD region) is provided between a channel formation region and a source region or drain region heavily doped with an impurity element. The present invention may also take a so-called GOLD (gate-drain overlapped LDD) structure in which an LDD region overlaps a gate electrode with a gate insulating film interposed therebetween.

Although an n-channel TFT is described here, a p-channel TFT can be formed instead if an n-type impurity element is replaced by a p-type impurity element.

Although a top gate TFT is taken as an example in the description here, the present invention can be applied to any TFT structure. For instance, the present invention is applicable to a bottom gate (reverse stagger) TFT and a forward stagger TFT.

Embodiment 2

This embodiment describes an example of manufacturing a TFT from an amorphous semiconductor film formed by plasma CVD on a glass substrate. The description will be given with reference to FIGS. 5A to 5E.

Figure 5A:
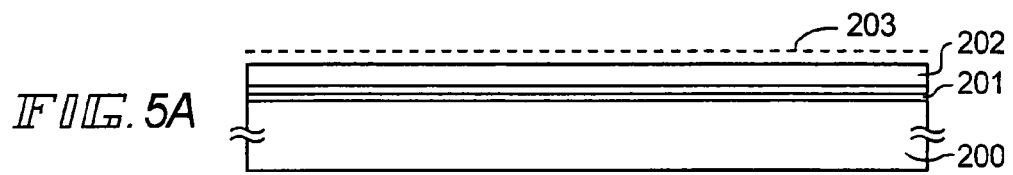
FIGS. 5A to 5E are diagrams showing a manufacturing process of the present invention (Embodiment 2)
Figure 5B:
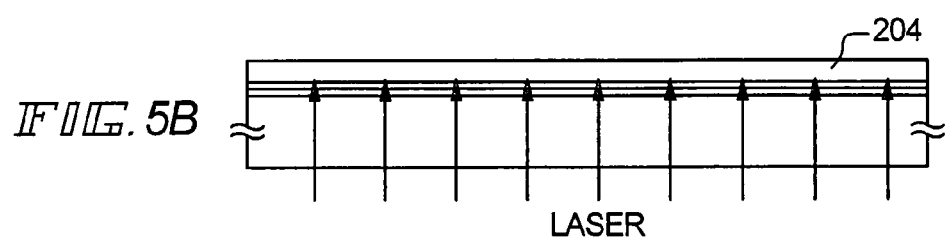

In FIG. 5A, reference symbol 200 denotes a substrate with an insulating surface, 201, a base insulating film, and 202, a semiconductor film with an amorphous structure.

First, an insulating film such as a silicon oxide film, a silicon nitride film, or a silicon oxynitride film is formed on the substrate 200 as the base insulating film 201 which serves as a blocking layer. The base insulating film 201 here has a two-layer structure (a silicon oxynitride film with a thickness of 50 nm and a silicon oxynitride film with a thickness of 100 nm). However, the base insulating film may be a single layer or a laminate which has more than two layers. The base insulating film may be omitted when a blocking layer is not necessary.

Next, the semiconductor film 202 with an amorphous structure is formed on the base insulating film by plasma CVD. When a semiconductor film with an amorphous structure is formed by plasma CVD, it is easier to form crystal nuclei than in a semiconductor film obtained by reduced pressure thermal CVD.

The surface of the semiconductor film 202 with an amorphous structure is irradiated with an ultraviolet ray in an atmosphere containing oxygen to form an oxide film (not shown), and a nickel thin film 203 is formed on the oxide film by sputtering (FIG. 5A). Although a nickel thin film is used here, nickel may be sprayed and scattered on the surface instead of forming a film.

Next, the semiconductor film is irradiated with linear excimer laser light from the back side of the substrate (FIG. 5B) to generate crystal nuclei through this laser light irradiation. However, the laser light is irradiated for increasing the number of crystal nuclei and most part of the semiconductor film remains amorphous. The semiconductor film at this point is a semiconductor film 204 with an amorphous structure in which the density of crystal nuclei is higher than in the semiconductor film 202 with an amorphous structure.

Figure 5C:
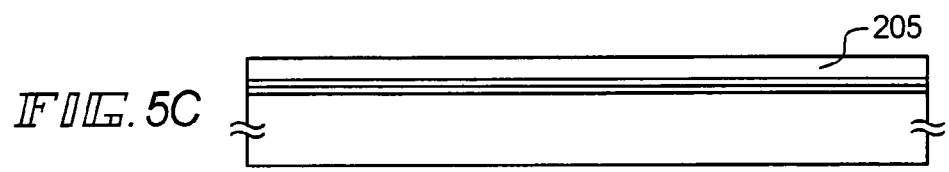

Next, the semiconductor film is crystallized by heat treatment to form a semiconductor film 205 with a crystal structure (FIG. 5C). Here, heat treatment at 450° C. for an hour is followed by heat treatment at 600° C. for twelve hours. The thus obtained semiconductor film 205 with a crystal structure has a relatively large grain size, about 5 μm, and the grain size is uniform throughout the film.

The grain size can be set suitably by adjusting laser in the energy density, the number of shots (overlap ratio), and the scanning rate.

Figure 5D:
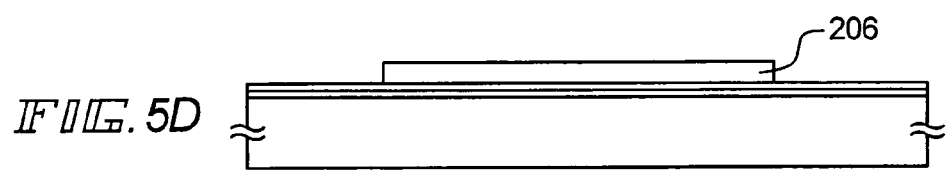

Next, the obtained semiconductor film 205 with a crystal structure is patterned to form a semiconductor layer 206 (FIG. 5D).

After washing the surface of the semiconductor layer with an etchant containing fluoric acid, an insulating film mainly containing silicon is formed to serve as a gate insulating film 207. The surface washing and formation of the gate insulating film are desirably carried out in succession without exposing the substrate to the air.

The surface of the gate insulating film is washed and then a gate electrode 208 is formed. The semiconductor layer is doped with an impurity element that gives a semiconductor the n-type conductivity (such as P or As), here, phosphorus, to form a source region 209 and a drain region 210. After the doping, the impurity element is activated by heat treatment, irradiation of intense light, or irradiation of laser light. The impurity element is activated, and at the same time, plasma damage to the gate insulating film and plasma damage to the interface between the gate insulating film and the semiconductor layer can be repaired. It is particularly effective to activate the impurity element by irradiating the second harmonic of a YAG laser from the front side or back side in an atmosphere at room temperature to 300° C. A YAG laser which requires little maintenance is preferable measures for activation.

When heat treatment is employed as activation measures, activation and gettering can be achieved simultaneously. Gettering here utilizes phosphorus doped in the source region or drain region. The metal element that accelerates crystal growth, doped before crystallization, is desirably removed from or reduced in the crystalline semiconductor film through gettering after the crystallization.

Figure 5E:
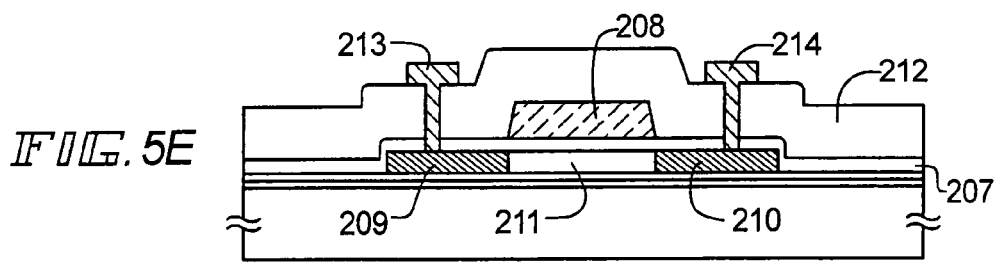

The subsequent steps include forming an interlayer insulating film 212, hydrogenating the semiconductor layer, forming contact holes that reach the source region and the drain region, and forming a source electrode 213 and a drain electrode 214. A TFT is thus completed (FIG. 5E).

Although the thus obtained TFT has a plurality of grain boundaries in a channel formation region 211, highly uniform crystal masses are obtained. There is little fluctuation between TFTs formed on the substrate.

Embodiment 3

Described here is a method of manufacturing a liquid crystal display device using an active matrix substrate which has a pixel portion. The description will be given with reference to FIGS. 6A to 10B.

An active matrix liquid crystal display device that uses a TFT as a switching element has a substrate on which pixel electrodes are arranged so as to form a matrix (active matrix substrate) and an opposite substrate on which an opposite electrode is formed. The active matrix substrate and the opposite substrate face each other via a liquid crystal layer. The distance between the substrates is kept constant by a spacer or the like. A liquid crystal layer is sealed between the substrates by a seal member placed on the outer periphery of the pixel portion.

An example of manufacturing active matrix substrate is given below.

Figure 6A:
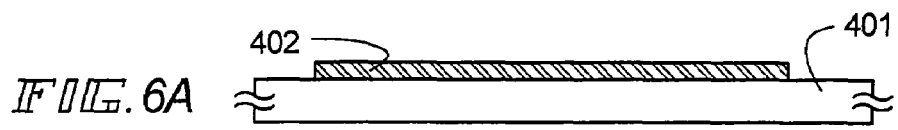
FIGS. 6A to 6D are diagrams showing a process of manufacturing an AM-LCD (Embodiment 3)

First, a conductive film is formed on a substrate 401 which has an insulating surface and is patterned to form a scanning line 402 (FIG. 6A). The scanning line 402 also functions as a light-shielding layer for protecting an active layer to be formed later from light. Here, a quartz substrate is used for the substrate 401 and the scanning line 402 is a laminate of a polysilicon film (75 nm in thickness) and a tungsten silicide (W—Si) film (150 nm in thickness). The polysilicon film also protects the substrate from contamination by tungsten silicide.

Figure 6B:
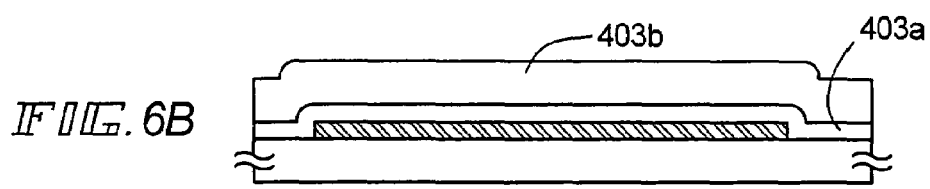

Next, insulating films 403a and 403b are formed to have a thickness of 100 to 1000 nm (typically 300 to 600 nm) to cover the scanning line 402 (FIG. 6B). Here, a silicon oxide film formed by CVD to have a thickness of 100 nm and a silicon oxide film formed by LPCVD to have a thickness of 480 nm are layered.

After the insulating film 403b is formed, the surface of the insulating film may be leveled by chemical-mechanical polishing called CMP. When CMP is employed, a suitable polishing agent (slurry) for an insulating film is, for example, fumed silica particles dispersed in a KOH-doped aqueous solution. Fumed silica is obtained by thermal cracking of silicon chloride gas. The insulating film is thinned by 0.1 to 0.5 μm with CMP to level the surface. For example, the insulating film is polished so that the insulating film is 0.5 μm in height, preferably, 0.3 μm, at the highest point (Rmax). After CMP, the surface of the insulating film is desirably washed with an etchant containing fluoric acid in order to remove impurities such as K (potassium).

Next, an amorphous semiconductor film is formed to have a thickness of 10 to 100 nm. Here, reduced pressure thermal CVD is used to form an amorphous silicon film with a thickness of 50 mm. A silicon oxide film with a thickness of 50 nm is formed on the amorphous silicon film by reduced pressure thermal CVD. In reduced pressure thermal CVD, a film is formed on each side of a substrate. Therefore, after a resist film is formed on the front side of the substrate, the silicon oxide film on the back side is removed by a solution containing fluoric acid and the amorphous silicon film on the back side is removed by a mixture gas of $SF_6$ and He. After the films on the back side are removed, the resist film is removed to remove the silicon oxide film on the front side.

The amorphous semiconductor film is then crystallized. In Embodiment 3, the entire surface of the amorphous silicon film is doped with a metal element that accelerates crystallization, the amorphous silicon film is irradiated with laser light (emitted from excimer laser at an energy density of 50 to 150 mJ/cm$^2$) from the back side of the substrate, and then heat treatment is performed. Thus formed is a crystalline silicon film in which crystal grains have a uniform grain size. The metal element used here is nickel. A solution containing 5 ppm of nickel that accelerates crystallization is applied after an oxide film is formed on the surface of the amorphous silicon film by using a solution containing ozone. Then, laser light of XeCl laser is irradiated from the back side of the substrate at an energy density of 85 mJ/cm$^2$, a frequency of 30 Hz, and a scanning rate of 0.1 mm/sec. in 132 shots.

Next, heat treatment (at 450° C. for an hour) for dehydrogenation is followed by heat treatment (at 600° C. for twelve hours) for crystallization. Through this crystallization, a silicon film (polysilicon film) which has a crystal structure of a uniform grain size (about 5 μm) is obtained.

A gettering step may be interposed here to remove Ni from a region that serves as an active layer of a TFT. In this case, the region for serving as the active layer of a TFT is covered with a mask (silicon oxide film), a part of the crystalline silicon film is doped with phosphorus (P) or argon (Ar), and heat treatment (at 600° C. for twelve hours in a nitrogen atmosphere) is performed.

Figure 6C:
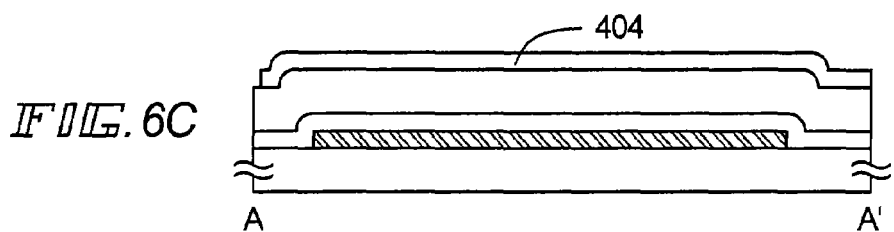
Figure 6D:
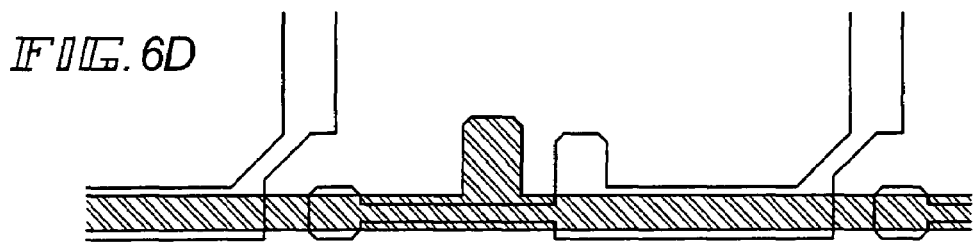

Next, unnecessary portions of the silicon film with a crystal structure are removed by patterning to form a semiconductor layer 404 (FIG. 6C). A top view of the pixel after the semiconductor layer 404 is formed is shown in FIG. 6D. A sectional view taken along the dotted line A-A' in FIG. 6D corresponds to FIG. 6C.

Figure 7A:
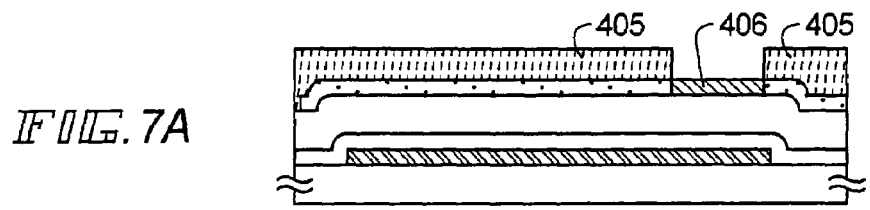
FIGS. 7A to 7D are diagrams which show a process of manufacturing an AM-LCD.

In order to a storage capacitor, a mask 405 is formed next and then a region 406 of the semiconductor layer (a region that serves as the storage capacitor) is doped with phosphorus (FIG. 7A).

Figure 7B:
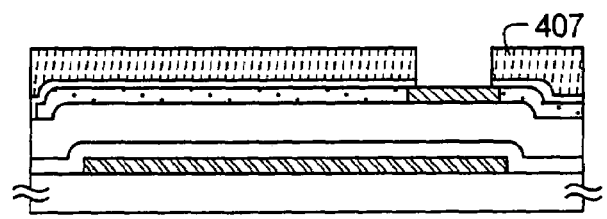

The mask 405 is removed and an insulating film is formed to cover the semiconductor layer. Thereafter, a mask 407 is formed and the insulating film on the region 406 that serves as the storage capacitor is removed (FIG. 7B).

Figure 7C:
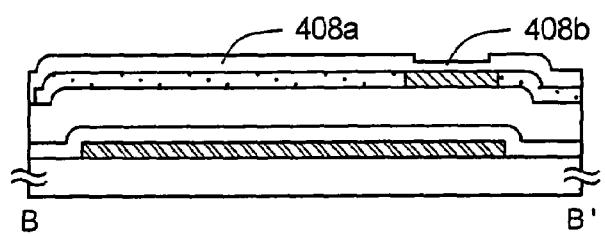
Figure 7D:
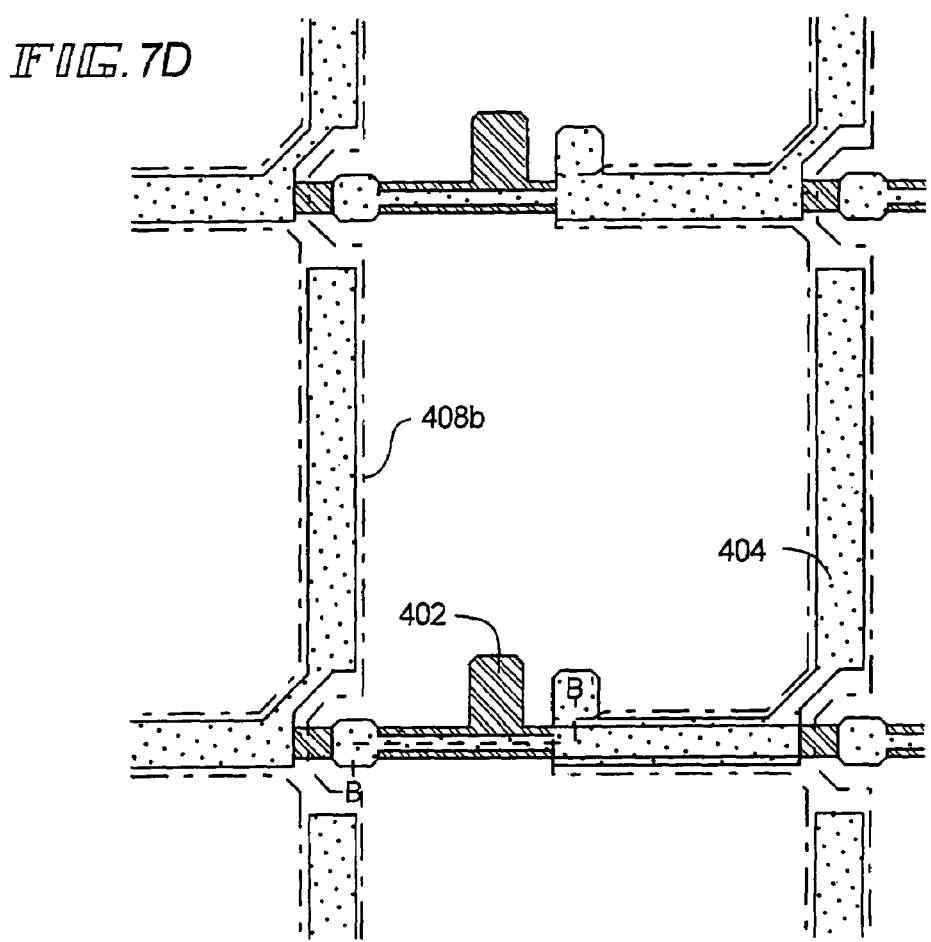

The mask 407 is then removed and an insulating film (gate insulating film) 408a is formed by thermal oxidization. Through the thermal oxidization, the final thickness of the gate insulating film becomes 80 nm. An insulating film 408b formed on the region 406 that serves as the storage capacitor is thinner than the insulating film on the other regions (FIG. 7C). A top view of the pixel at this point is shown in FIG. 7D. A sectional view taken along the dotted line B-B' in FIG. 7D corresponds to FIG. 7C. A region indicated by the dot-dash line in FIG. 7D is the region on which the thin insulating film 408b is formed.

The next step is channel doping in which a region that serves as a channel region of a TFT is selectively or entirely doped with a low concentration of p-type or n-type impurity element. The channel doping step is a step for controlling the threshold voltage of the TFT. Here, boron is doped by ion doping in which diborane ($B_2H_6$) is subjected to plasma excitation without mass separation. Ion implantation involving mass separation may be employed instead.

Figure 8A:
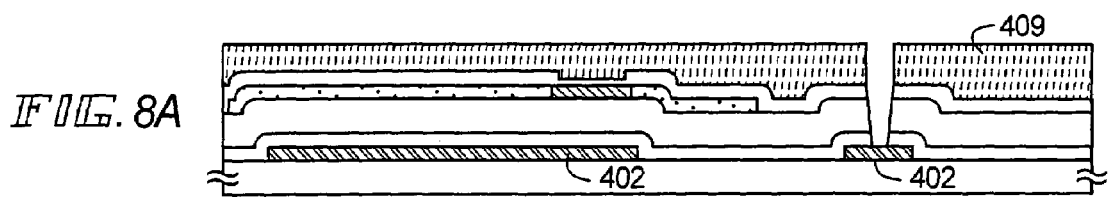
FIGS. 8A to 8D are diagrams which show a process of manufacturing an AM-LCD.

A mask 409 is formed on the insulating film 408a and 408b to form a contact hole that reaches the scanning line 402 (FIG. 8A). After the contact hole is formed, the mask is removed.

Figure 8B:
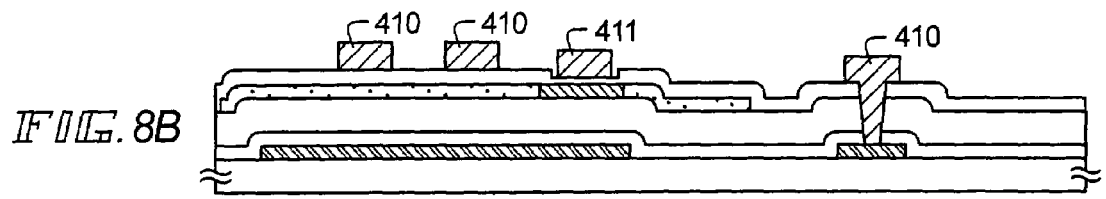

A conductive film is then formed and patterned to form a gate electrode 410 and a capacitance wiring line 411 (FIG. 8B). Used here is a laminate of a silicon film (150 nm in thickness) doped with phosphorus and a tungsten silicide film (150 nm in thickness). The storage capacitor is constituted of the capacitance wiring line 411 and the region 406 of the semiconductor layer with the insulating film 408b as dielectric.

Figure 8C:
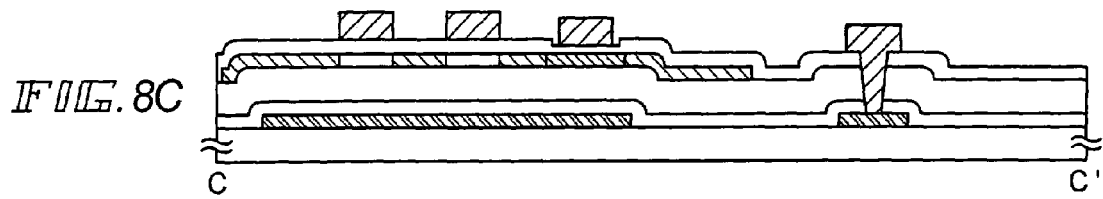
Figure 8D:
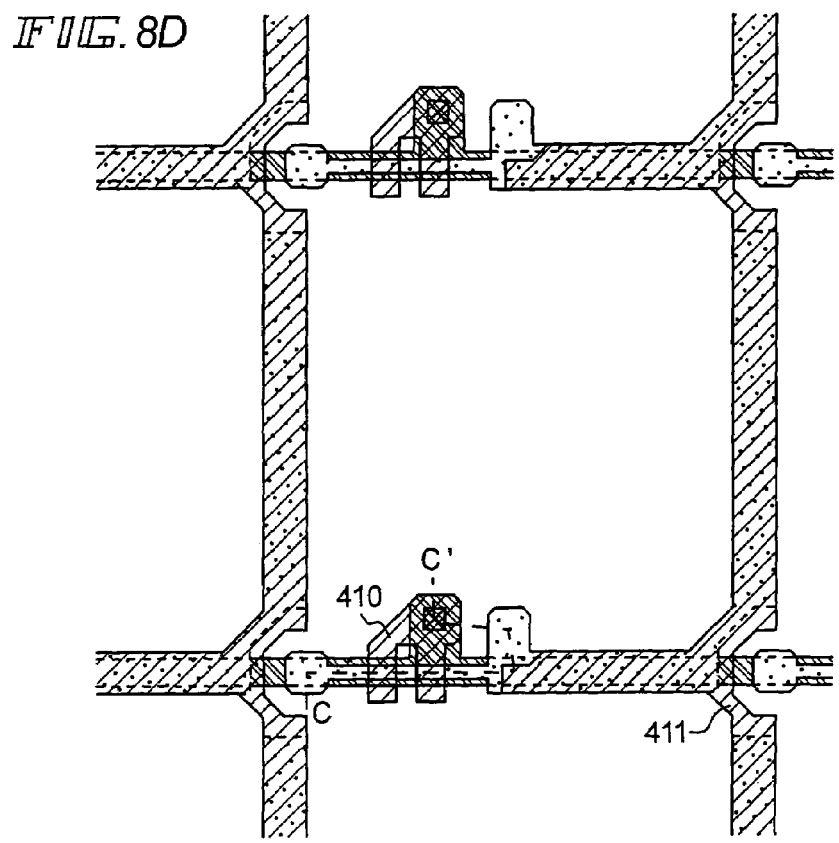

Next, using the gate electrode 410 and the capacitance wiring line 411 as masks, the semiconductor layer is doped with a low concentration of phosphorus in a self-aligning manner (FIG. 8C). A top view of the pixel at this point is shown in FIG. 8D. A sectional view taken along the dotted line C-C' in FIG. 8D corresponds to FIG. 8C. The concentration of the phosphorus concentration is adjusted so as to reach $1 \times 10^{16}$ to $5 \times 10^{18}$ atoms/cm³, typically, $3 \times 10^{17}$ to $3 \times 10^{18}$ atoms/cm³.

Figure 9A:
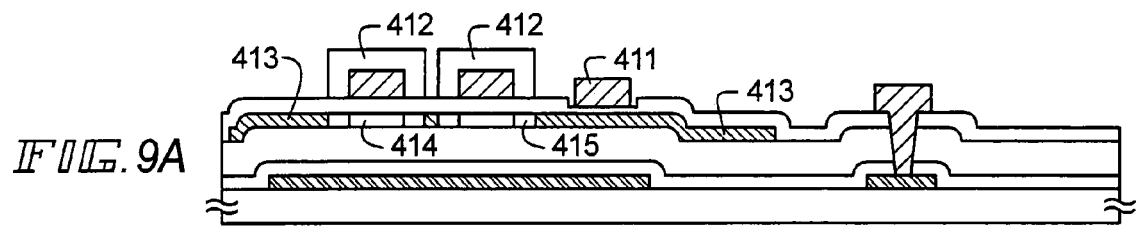
FIGS. 9A to 9C are diagrams which show a process of manufacturing an AM-LCD.

A mask 412 is formed and the semiconductor layer is doped with a high concentration of phosphorus to form a high concentration impurity region 413 that serves as a source region or a drain region (FIG. 9A). The concentration of the phosphorus in the high concentration impurity region is adjusted so as to reach $1 \times 10^{20}$ to $1 \times 10^{21}$ atoms/cm³ (typically, $2 \times 10^{20}$ to $5 \times 10^{20}$ atoms/cm³). Of the semiconductor layer 404, a region that overlaps the gate electrode 410 serves as a channel formation region 414 and a region covered with the mask 412 forms a low concentration impurity region 415 to function as an LDD region. After doping of the impurity element is finished, the mask 412 is removed.

Though not shown in the drawings, a region for forming an n-channel TFT is covered with a mask and the semiconductor layer is doped with boron to form a source region or drain region for a p-channel TFT of a driving circuit formed on the same substrate on which pixels are formed.

After the mask 412 is removed, a passivation film 416 is formed to cover the gate electrode 410 and the capacitance wiring line 411. The passivation film prevents oxidization of the gate electrode and functions as an etching stopper in a later leveling step. A silicon oxide film with a thickness of 70 nm is used here for the passivation film. The next step is heat treatment for activating the n-type and p-type impurity elements used to dope the semiconductor layer in different concentrations. Heat treatment here is conducted at 950° C. for 30 minutes.

Figure 9B:
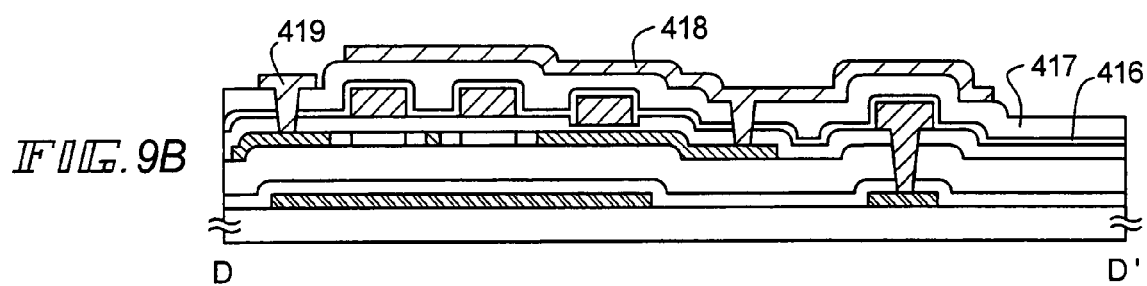
Figure 9C:
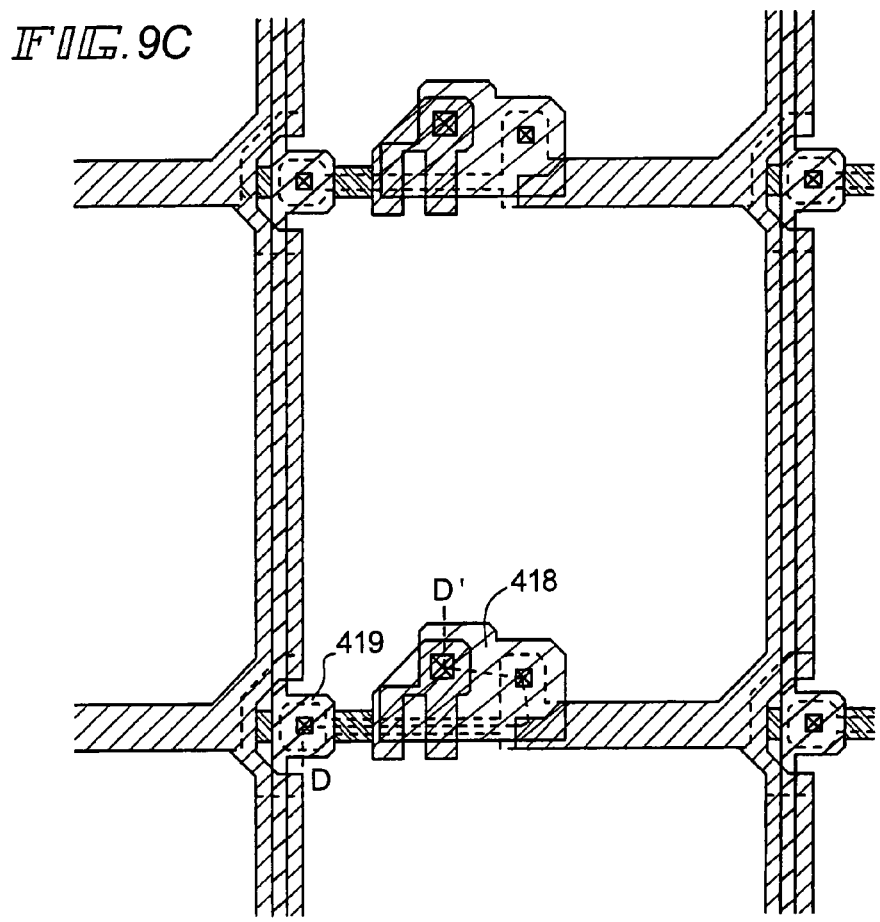

An interlayer insulating film 417 is formed next from an organic resin material or a silicon material. A silicon oxynitride film with a thickness of 1 μm is used here, and is leveled by etch back. Contact holes to reach the semiconductor layer are formed to form an electrode 418 and a source wiring line 419. In Embodiment 3, the electrode 418 and the source wiring line 419 are a laminate of three layers that are formed in succession by sputtering. The three layers are a Ti film with a thickness of 100 nm, an aluminum film containing Ti with a thickness of 300 nm, and a Ti film with a thickness of 150 nm (FIG. 9B). A sectional view taken along the dotted line D-D' in FIG. 9C corresponds to FIG. 9B.

Figure 10A:
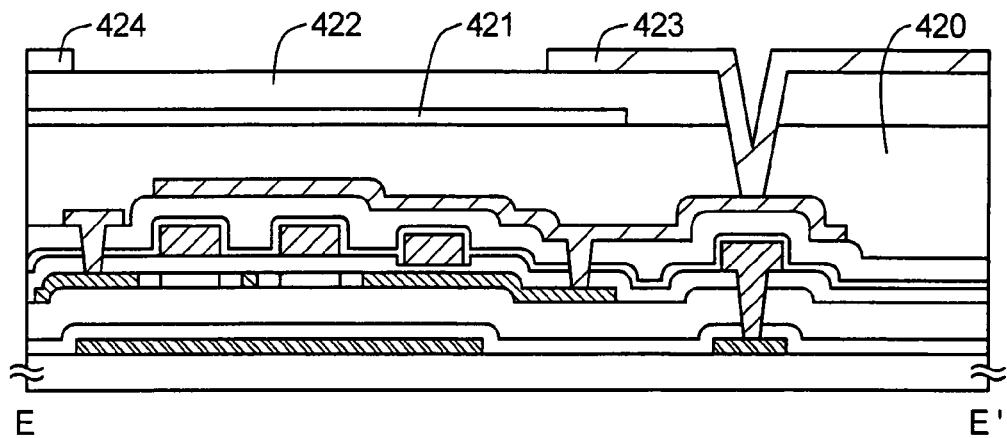
FIGS. 10A and 10B are diagrams which show a process of manufacturing an AM-LCD.
Figure 10B:
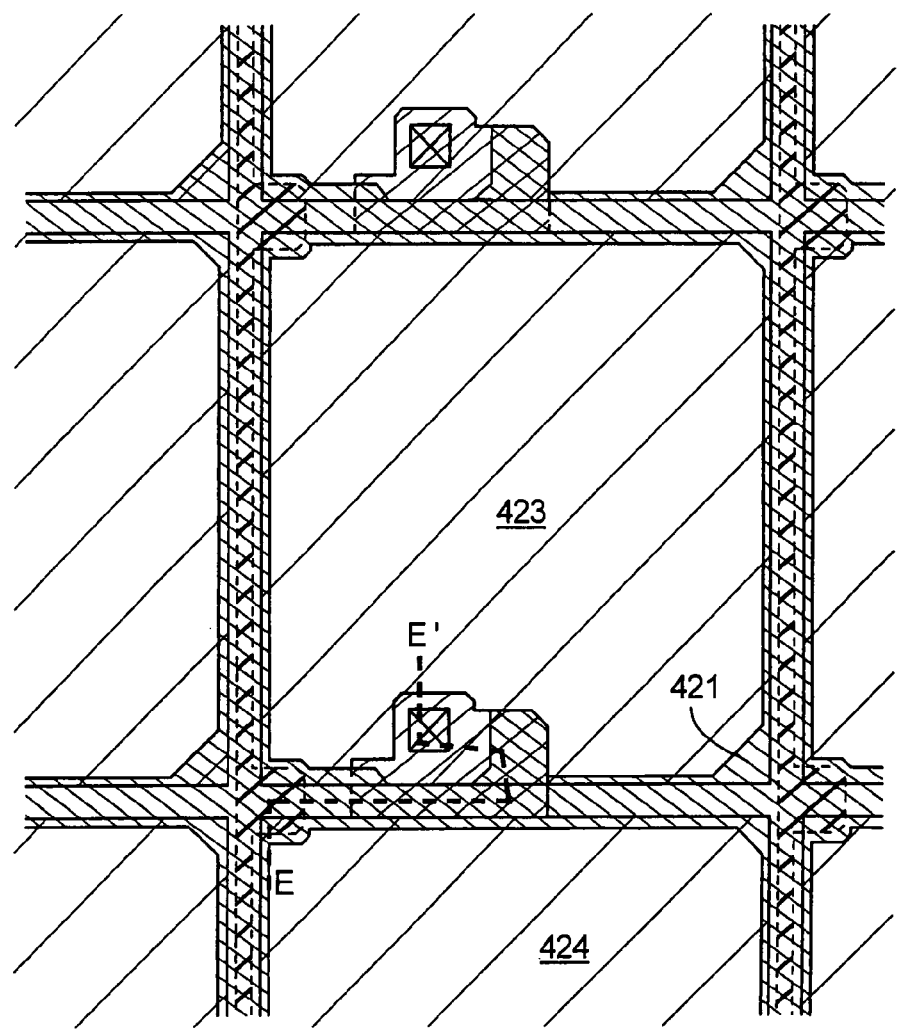

After hydrogenation treatment, a laminate of a silicon oxynitride film (500 nm in thickness) and a BCB film (1 μm in thickness) is formed as an interlayer insulating film 420 (FIG. 10A). A conductive film (100 nm in thickness) which is capable of shielding against light is formed on the interlayer insulating film 420, and patterned to form a light-shielding layer 421. A silicon oxynitride film with a thickness of 150 nm is formed next as an interlayer insulating film 422. Then, a contact hole to reach the electrode 418 is formed. A transparent conductive film (here, an indium tin oxide, ITO, film) with a thickness of 100 nm is formed and then patterned to form pixel electrodes 423 and 424. A sectional view taken along the dotted line E-E' in FIG. 10B corresponds to FIG. 10A.

In this way, a pixel TFT that is an n-channel TFT and a storage capacitor with enough capacitance (51.5 fF) are formed in the pixel portion while a sufficient area (aperture ratio: 76.5%) is secured for a display region (pixel size: 26 μm×26 μm).

This embodiment is merely an example and the present invention is not limited to the process of this embodiment. For example, the conductive films in this embodiment may be formed of an element selected from the group consisting of tantalum (Ta), titanium (Ti), molybdenum (Mo), tungsten (W), chromium (Cr), and silicon (Si), or of an alloy containing a combination of the elements listed above (typically a Mo—W alloy or a Mo—Ta alloy). A silicon oxide film, a silicon nitride film, a silicon oxynitride film, or an organic resin material (such as polyimide, acrylic, polyamide, polyimideamide, BCB (benzocyclobutene)) film can be used for the insulating films of this embodiment.

TFTs obtained in accordance with Embodiment 3 exhibit excellent electric characteristics.

Figure 11A:
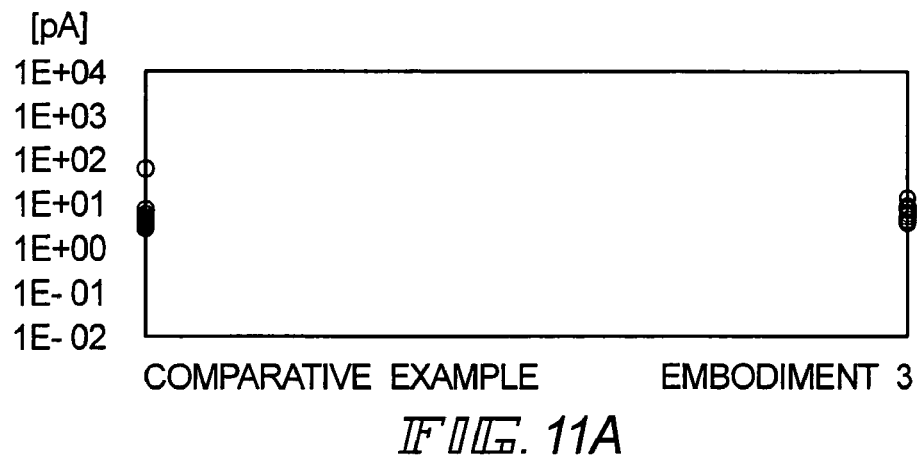
FIGS. 11A and 11B are graphs showing the OFF current value of n-channel TFTs (L/W=8/8)
Figure 11B:
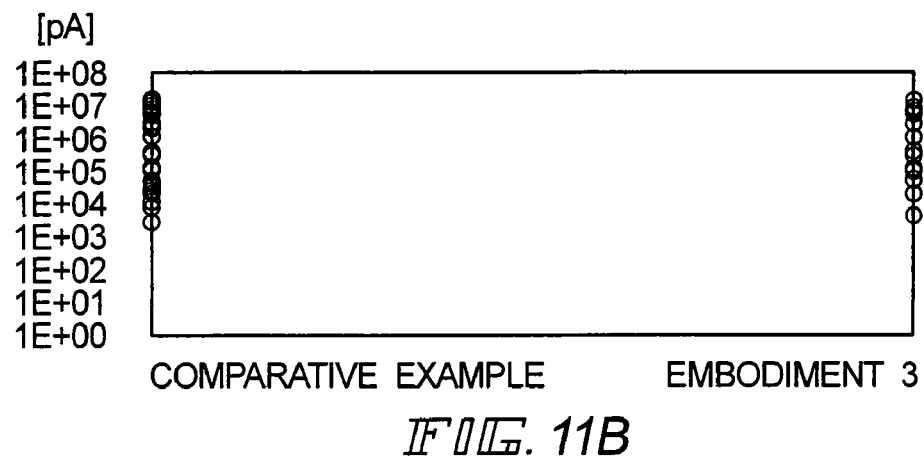
Figure 12:
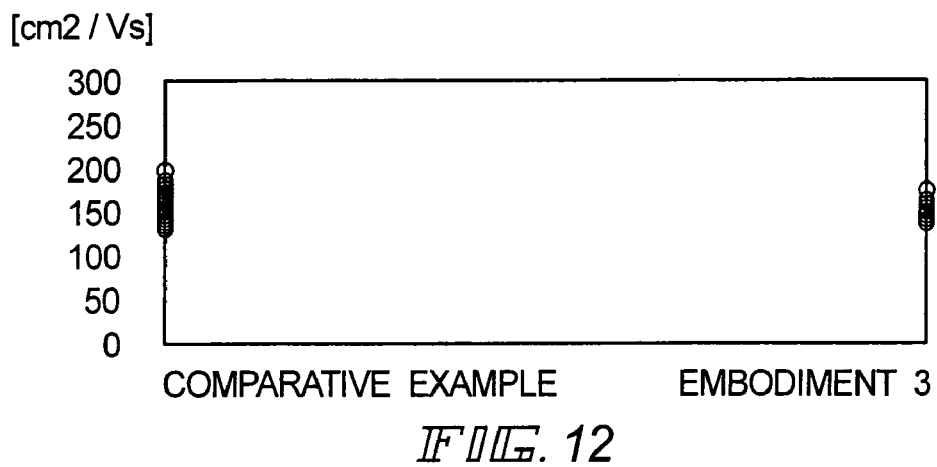
FIG. 12 is a graph showing the field effect mobility of n-channel TFTs (L/W=8/8)

Fluctuation in characteristics between the TFTs is small. In particular, fluctuation in OFF current value (L/W=8 μm/8 μm) between TFTs in this embodiment is smaller than the fluctuation of the comparative sample, as shown in FIGS. 11A and 11B. The comparative sample in FIGS. 11A and 11B is TFTs obtained under the same conditions as the TFTs of this embodiment except that only the laser light irradiation from the back side is omitted in manufacturing the TFTs of the comparative sample. FIG. 11A shows the OFF current value in 1V of the difference in voltage between a source region and a drain region of a TFT. FIG. 11B shows the OFF current value in 5V of the difference in voltage between a source region and a drain region of a TFT. As shown in FIG. 12, fluctuation in field effect mobility between TFTs of this embodiment is also small.

Figure 13A:
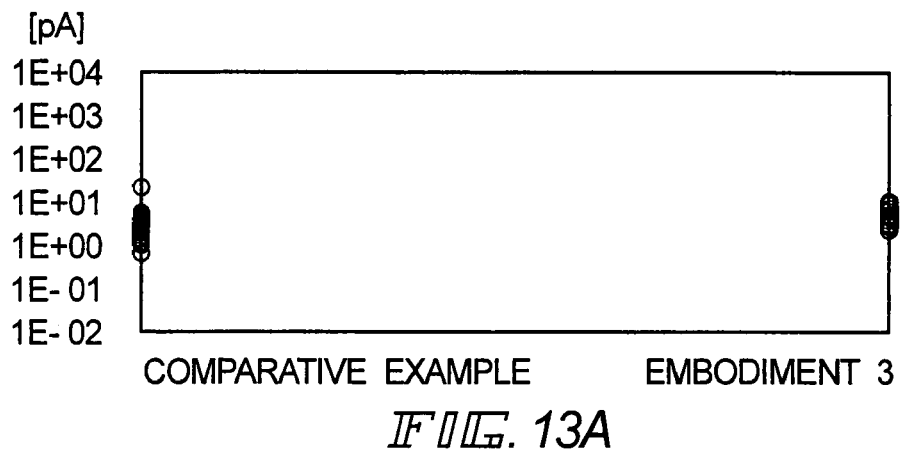
FIGS. 13A and 13B are graphs showing the OFF current value of n-channel TFTs (L/W=50/50)
Figure 13B:
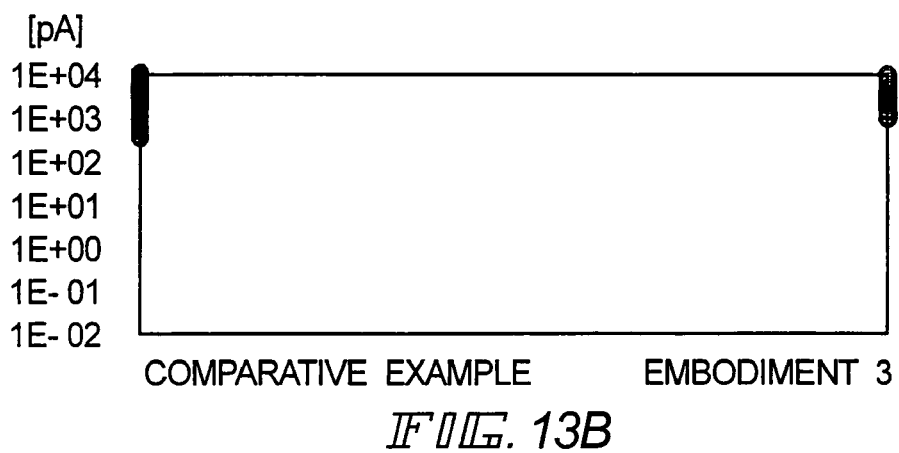
Figure 14:
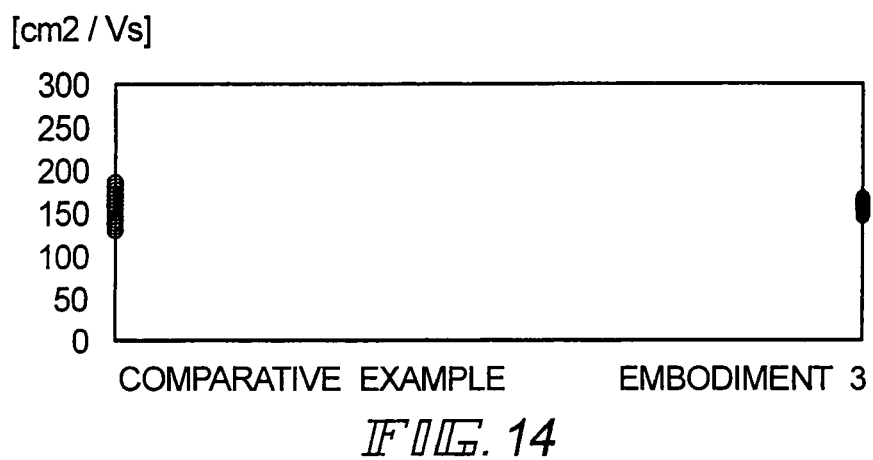
FIG. 14 is a graph showing the field effect mobility of n-channel TFTs (L/W=50/50)

As shown in FIGS. 13A and 13B and FIG. 14, fluctuation in characteristics between TFTs with a channel size that satisfies L/W=50 μm/50 μm is even smaller. FIG. 13A shows the OFF current value in 1V of the difference in voltage between a source region and a drain region of a TFT. FIG. 13B shows the OFF current value in 5V of the difference in voltage between a source region and a drain region of a TFT is 5 V.

In Embodiment 3, a transparent conductive film is used for a pixel electrode to manufacture an active matrix substrate for a transmissive display device. However, it is also possible to manufacture an active matrix substrate for a reflective display device if a pixel electrode is formed from a reflective material.

Embodiment 4

The description in Embodiment 3 takes as an example a top gate TFT. The present invention is also applicable to a bottom gate TFT shown in FIGS. 16A and 16B.

Figure 16A:
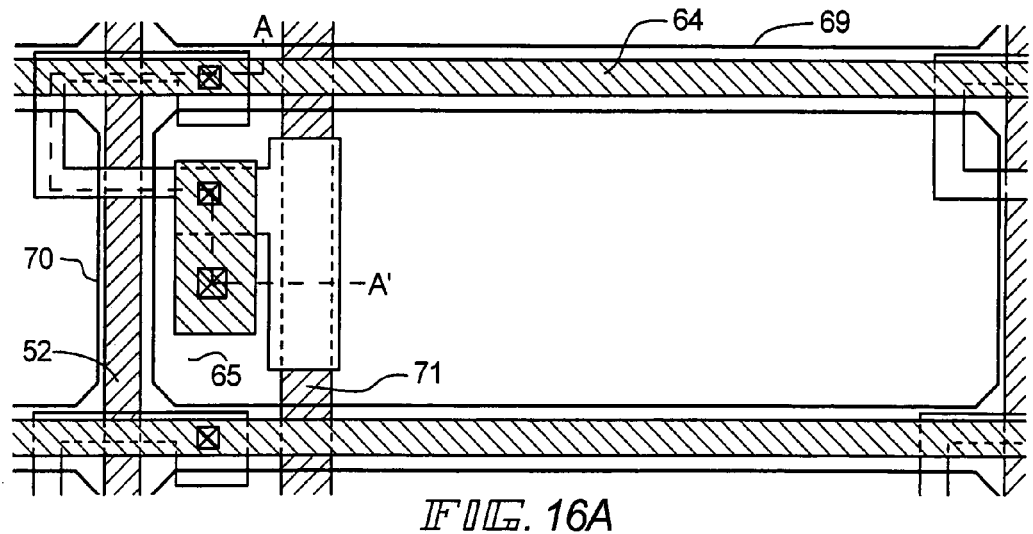
FIGS. 16A and 16B are diagrams showing a manufacturing process of the present invention (Embodiment 4)

FIG. 16A is an enlarged top view of one of pixels in a pixel portion. A section taken along the dotted line A-A' in FIG. 16A corresponds to the sectional structure of the pixel portion in FIG. 16B.

Figure 16B:
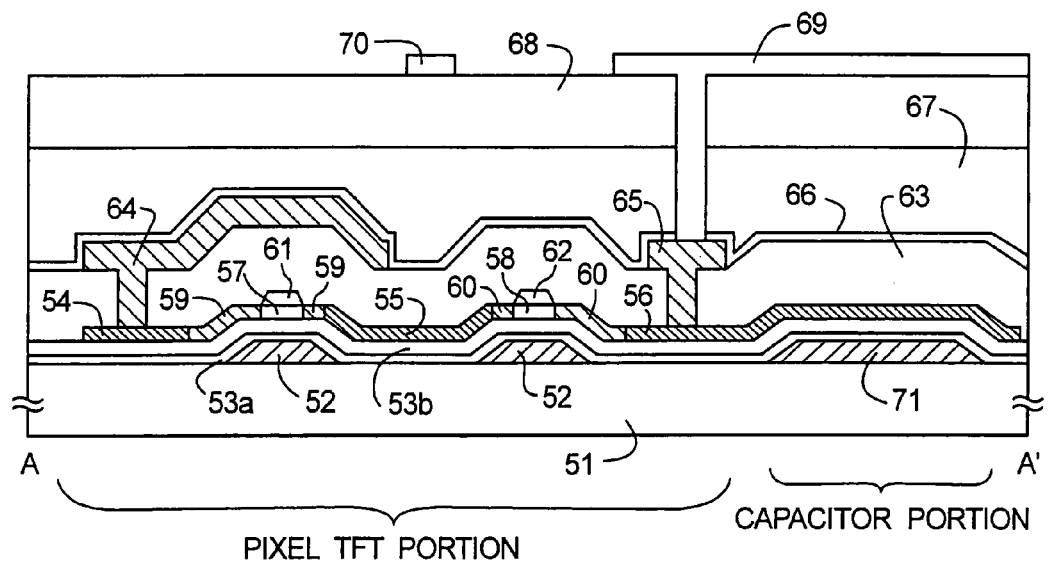

In the pixel portion shown in FIGS. 16A and 16B, n-channel TFTs constitute the pixel TFT portion. A gate electrode 52 is formed on a substrate 51. A first insulating film 53a is formed on the gate electrode from silicon nitride and a second insulating film 53b is formed on the first insulating film from silicon oxide. An active layer is formed on the second insulating film. The active layer is composed of source and drain regions 54 to 56, channel formation regions 57 and 58, and LDD regions 59 and 60. Each LDD region is placed between one channel formation region and one source or drain region. The channel formation regions 57 and 58 are protected by insulating layers 61 and 62, respectively. Contact holes are formed in a first interlayer insulating film 63 that covers the insulating layers 61 and 62 and the active layer. A wiring line 64 is formed to be connected to the source region 54 and a wiring line 65 is formed to be connected to the drain region 56. A passivation film 66 is formed on the wiring lines. A second interlayer insulating film 67 is formed on the passivation film. A third interlayer insulating film 68 is formed on the second interlayer insulating film. A pixel electrode 69 is formed from a transparent conductive film such as an ITO film or a $SnO_2$ film and is connected to the wiring line 65. Denoted by 70 is a pixel electrode adjacent to the pixel electrode 69.

In this embodiment, the active layer is formed in accordance with Embodiment Mode. First, the gate electrode 52 is formed on the substrate 51. The first insulating film 53a is formed on the gate electrode from silicon nitride and the second insulating film 53b is formed on the first insulating film from silicon oxide. Then, an amorphous silicon film is formed. The amorphous silicon film is doped with nickel by applying an aqueous solution that contains nickel, or by forming a very thin nickel film through sputtering. Next, the amorphous silicon film is irradiated with laser light (an energy density of 50 to 150 $mJ/cm^2$) from the back side of the substrate and then subjected to heat treatment to form a crystalline silicon film. The crystalline silicon film thus can have crystal masses with an uniform size. According to the present invention, a crystalline silicon film which is uniform over the entire surface can be obtained irrespective of the presence or absence of a gate electrode under the insulating film that is under the crystalline silicon film. Nickel is then removed or reduced by gettering. The crystalline silicon film is patterned to form the active layer.

Although a bottom gate TFT of channel stop type is described as an example in this embodiment, the present invention is not particularly limited thereto.

The gate wiring line of the pixel TFT in the pixel portion of this embodiment is arranged so as to form a double gate structure. However, the present invention may take a triple gate structure or other multi-gate structure in order to reduce fluctuation in OFF current. A single gate structure may also be employed in order to improve the aperture ratio.

A capacitor portion of the pixel portion is composed of a capacitance wiring line 71 and the drain region 56 with the first insulating film and the second insulating film as dielectric.

The pixel portion shown in FIGS. 16A and 16B is merely an example and the present invention is not particularly limited to the above structure.

Embodiment 5

Embodiment 5 describes a process of manufacturing an active matrix liquid crystal display device from the active matrix substrate fabricated in Embodiment 3. The description is given with reference to FIG. 17.

After the active matrix substrate as illustrated in FIG. 10 is obtained in accordance with Embodiment 3, an orientation film is formed on the active matrix substrate of FIG. 10 and subjected to rubbing treatment. In this embodiment, an organic resin film such as an acrylic resin film is patterned to form columnar spacers in desired positions in order to keep the distance between the substrates before the orientation film is formed. The columnar spacers may be replaced by spherical spacers sprayed onto the entire surface of the substrate.

An opposite substrate is prepared next. The opposite substrate has a color filter in which colored layers and light-shielding layers are arranged with respect to the respective pixels. A light-shielding layer is also placed in the driving circuit portion. A leveled film is formed to cover the color filter and the light-shielding layer. On the leveled film, an opposite electrode is formed from a transparent conductive film in the pixel portion. An orientation film is formed over the entire surface of the opposite substrate and is subjected to rubbing treatment.

Then the opposite substrate is bonded to the active matrix substrate on which the pixel portion and the driving circuits are formed, through a sealing member. The sealing member has filler mixed therein and the filler, together with the columnar spacers, keeps the distance between the two substrates while they are bonded. Thereafter a liquid crystal material is injected between the substrates and an encapsulant (not shown) is used to completely seal the substrates. A known liquid crystal material can be used. The active matrix liquid crystal display device is thus completed. If necessary, the active matrix substrate or the opposite substrate is cut into pieces with desired shapes. The display device may be appropriately provided with a polarizing plate using a known technique. Then FPCs are attached using a known technique.

Figure 17:
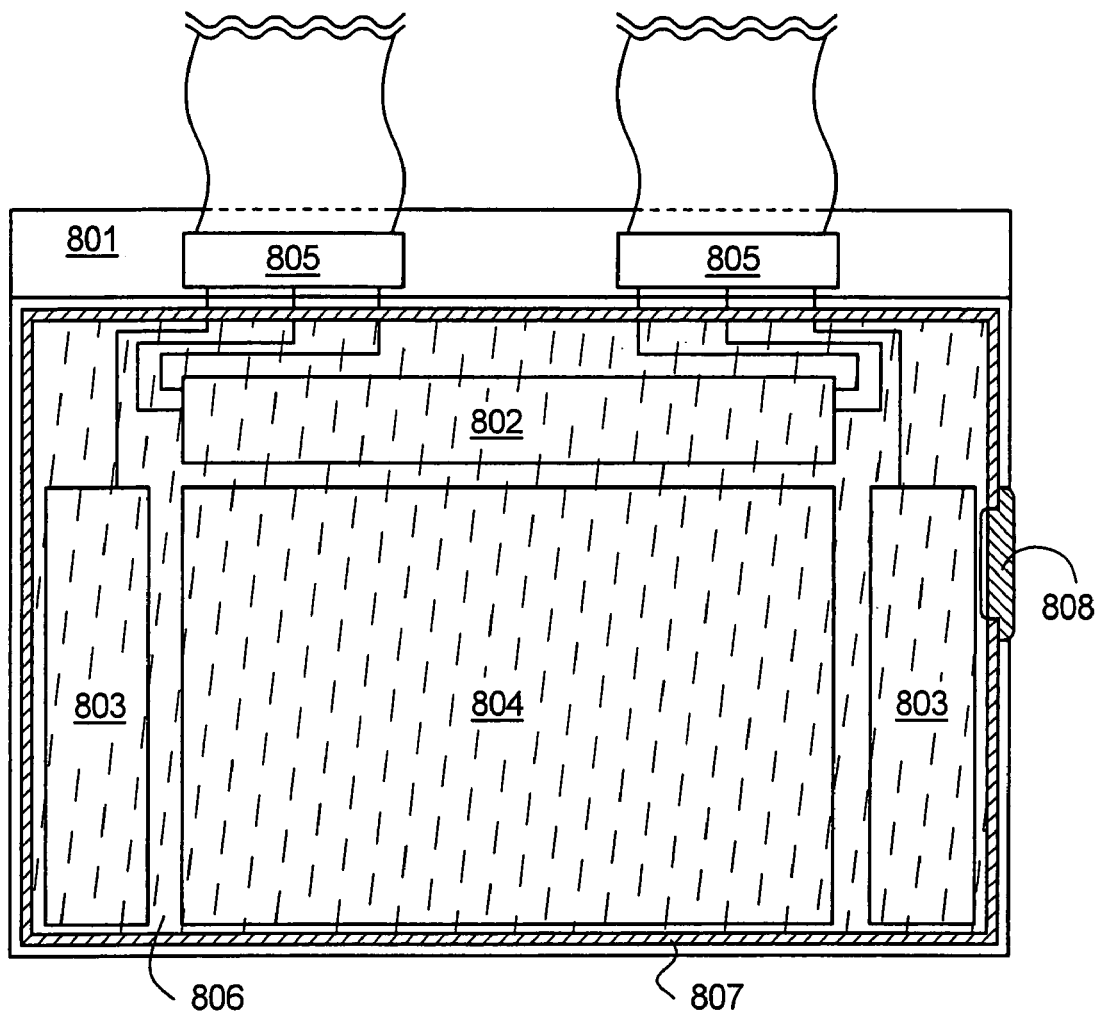
FIG. 17 is a diagram showing a liquid crystal module (Embodiment 5)

The structure of the thus obtained liquid crystal module is described with reference to the top view in FIG. 17.

A pixel portion 804 is placed in the center of an active matrix substrate 801. In FIG. 17, a source signal line driving circuit 802 for driving source signal lines is positioned above the pixel portion 804. Gate signal line driving circuits 803 for driving gate signal lines are placed at the left and right sides of the pixel portion 804. Although the gate signal line driving circuits 803 are symmetrical with respect to the pixel portion in this embodiment, the liquid crystal module may have only one gate signal line driving circuit at one side of the pixel portion. A designer can choose the arrangement that suits better considering the substrate size of the liquid crystal module, or the like. However, the symmetrical arrangement of the gate signal line driving circuits shown in FIG. 17 is preferred in terms of circuit operation reliability, driving efficiency, and the like.

Signals are inputted to the driving circuits from flexible printed circuits (FPC) 805. The FPCs 805 are press-fit through an anisotropic conductive film or the like after opening contact holes in the interlayer insulating film and resin film and forming a connection electrode so as to reach the wiring lines arranged in given places of the substrate 801. The connection electrode is formed from ITO in this embodiment.

A sealing agent 807 is applied to the substrate to surround the driving circuits and the pixel portion. An opposite substrate 806 is bonded to the substrate 801 through the sealing agent 807 while a spacer formed in advance on the active matrix substrate keeps the gap between the two substrates (the substrate 801 and the opposite substrate 806) constant. A liquid crystal element is injected through an area of the substrate that is not coated with the sealing agent 807. The substrates are then sealed by an encapsulant 808. The liquid crystal module is completed through the above steps.

Although all of the driving circuits are formed on the substrate here, several ICs may be used for some of the driving circuits.

In addition, this embodiment can be applied to the active matrix substrate obtained in Embodiment 4 substituted for that obtained in Embodiment 3.

Embodiment 6

This embodiment shows an example of manufacturing a light emitting display device which has an EL (electro luminescence) element.

A pixel portion, a source side driving circuit, and a gate side driving circuit are formed on a substrate with an insulating surface (for example, a glass substrate, a crystallized glass substrate, a plastic substrate, and the like). The pixel portion and the driving circuits can be obtained in accordance with the description in Embodiment 1 or Embodiment 2. When a semiconductor film with a crystal structure is formed for active layers of TFTs in the pixel portion and driving circuits, an amorphous semiconductor film is doped with a metal element that accelerates crystallization and then irradiated with laser light with energy which is not large enough to melt the semiconductor film. As a result, the metal element is diffused in the solid semiconductor film, which helps crystallization in later heat treatment.

When the semiconductor film is crystallized without using a metal element that accelerates crystallization, it also improves later crystallization to irradiate laser light with energy which is not large enough to melt a semiconductor film before crystallization. Impurities (elements which has high diffusion constant in the semiconductor film, hydrogen, for example) contained in the semiconductor film with an amorphous structure are diffused in the solid semiconductor film and crystallization in later heat treatment is performed better. When a semiconductor film with a uniform amorphous structure is crystallized by irradiation of laser light with energy which is not large enough to melt the semiconductor film, a semiconductor film with a uniform crystal structure can be obtained. Accordingly, TFTs which have as their active layers this semiconductor film with a crystal structure are uniform in characteristics to reduce fluctuation in luminance.

The pixel portion and the driving circuits are covered with a seal member, which in turn is covered with a protective film. Further, sealing is completed by a cover member with an adhesive. The cover member is desirably formed from the same material as the substrate, for example, a glass substrate, in order to prevent deformation due to heat and external force. The cover member is processed by sand blasting or the like to have a concave shape (depth: 3 to 10 μm). Desirably, the cover member is further processed to have a dent (depth: 50 to 200 μm) in which a drying agent is placed. If more than one EL modules are to be obtained from one sheet, $CO_2$ laser or the like is used to cut out a module with its ends flush after bonding the cover member to the substrate.

Described next is the sectional structure of the device. An insulating film is formed on a substrate. A pixel portion and a gate side driving circuit are formed on the insulating film. The pixel portion is composed of a plurality of pixels each including a current controlling TFT and a pixel electrode that is electrically connected to a drain of the current controlling TFT. The gate side driving circuit is built from a CMOS circuit in which an n-channel TFT and a p-channel TFT are combined. These TFTs can be manufactured in accordance with Embodiment 1 or Embodiment 2.

The pixel electrode functions as an anode of an EL element. A bank is formed on each end of the pixel electrode. An EL layer and cathode of the EL element are formed on the pixel electrode.

The EL layer (a layer which emits light and in which carriers moves for light emission) is a combination of a light emitting layer, an electric charge transporting layer, and an electric charge injecting layer. For example, a low molecular weight organic EL material or a high molecular weight organic EL material is used for the EL layer. A thin film of a light emitting material (singlet compound) that emits light from singlet excitation (fluorescence), or a thin film of a light emitting material (triplet compound) that emits light from triplet excitation (phosphorescence) may be used in the EL layer. An inorganic material such as silicon carbide may be used for the electric charge transporting layers and electric charge injecting layers. These organic EL materials and inorganic materials can be known materials.

The cathode also functions as a common wiring line to all the pixels and is electrically connected to an FPC through a connection wiring line. All the elements included in the pixel portion and gate side driving circuit are covered with the cathode, the seal member, and the protective film.

The seal member is preferably formed from a transparent or translucent material with respect to visible light. It is also desirable to use for the seal member a material that transmits as little moisture and oxygen as possible.

After the light emitting element is completely covered with the seal member, the protective film formed of a DLC film or the like is placed at least on the surface (the exposed surface) of the seal member. The protective film may cover all the surfaces including the back side of the substrate. However, it is important to avoid forming the protective film in a portion where an external input terminal (FPC) is to be placed. In order to avoid forming the protective film in this portion, a mask may be used or the external input terminal portion may be covered with a tape such as Teflon (registered trade mark) that is used as a masking tape in CVD apparatus.

By sealing as above using the seal member and the protective film, the EL element is completely shut off from the outside and external substances such as moisture and oxygen, that accelerates degradation by oxidization of EL layer, are prevented from entering the element. Accordingly, a light emitting device with high reliability can be obtained.

The light emitting device can emit light in the reverse direction to the above structure if the pixel electrode serves as a cathode and an EL layer and an anode are layered on the cathode.

The present invention can reduce fluctuation in ON current ($I_{on}$) of TFTs (TFTs for supplying current to a driving circuit or to an OLED in a pixel) arranged so that a constant current flows in a pixel electrode, and therefore can reduce fluctuation in luminance.

Embodiment 7

The TFT fabricated by implementing the present invention can be utilized for various modules (active matrix liquid crystal module, active matrix EL module and active matrix EC module). Namely, all of the electronic apparatuses are completed by implementing the present invention.

Following can be given as such electronic apparatuses: video cameras; digital cameras; head mounted displays (goggle type displays); car navigation systems; projectors; car stereo; personal computers; portable information terminals (mobile computers, mobile phones or electronic books etc.) etc. Examples of these are shown in FIGS. 18A to 18F, 19A to 19D and 20A to 20C.

Figure 18A:
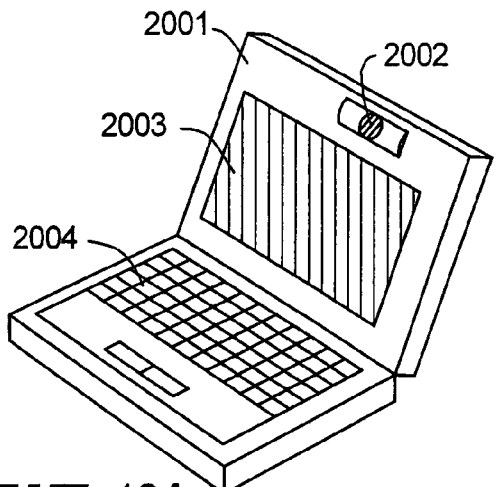
FIGS. 18A to 18F are diagrams showing electronic equipment (Embodiment 7)

FIG. 18A is a personal computer which comprises: a main body 2001; an image input section 2002; a display section 2003; and a keyboard 2004.

Figure 18B:
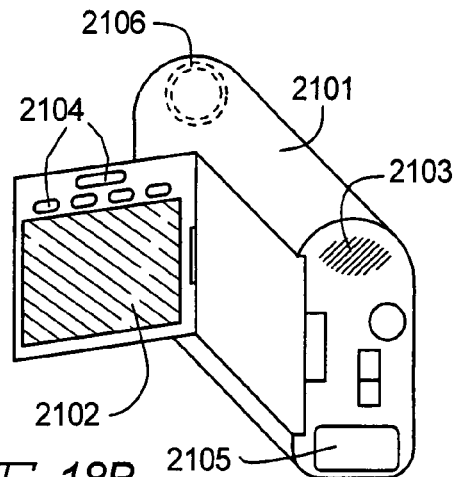

FIG. 18B is a video camera which comprises: a main body 2101; a display section 2102; a voice input section 2103; operation switches 2104; a battery 2105 and an image receiving section 2106.

Figure 18C:
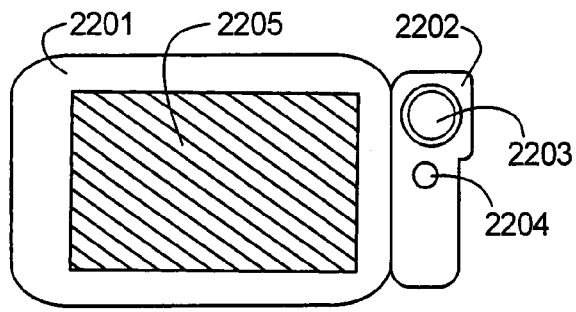

FIG. 18C is a mobile computer which comprises: a main body 2201; a camera section 2202; an image receiving section 2203; operation switches 2204 and a display section 2205.

Figure 18D:
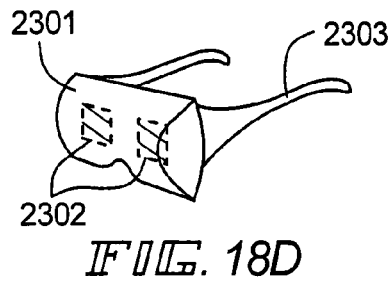

FIG. 18D is a goggle type display which comprises: a main body 2301; a display section 2302; and an arm section 2303.

Figure 18E:
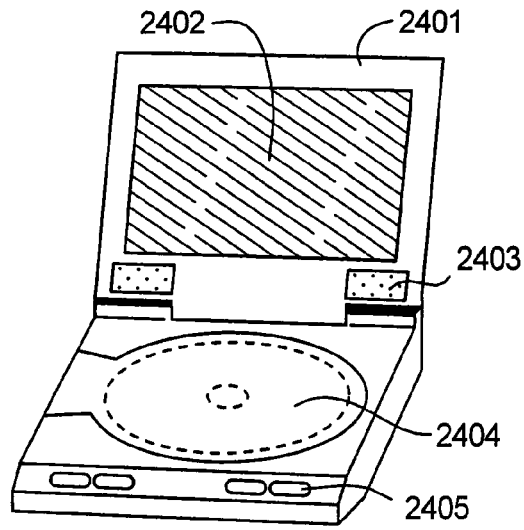

FIG. 18E is a player using a recording medium which records a program (hereinafter referred to as a recording medium) which comprises: a main body 2401; a display section 2402; a speaker section 2403; a recording medium 2404; and operation switches 2405. This apparatus uses DVD (digital versatile disc), CD, etc. for the recording medium, and can perform music appreciation, film appreciation, games and use for Internet.

Figure 18F:
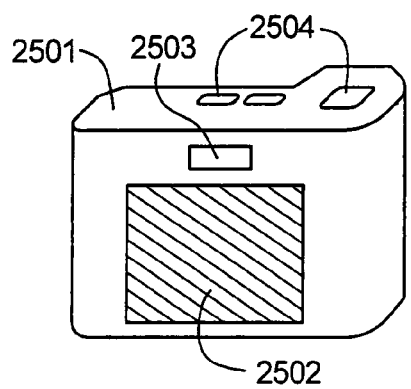

FIG. 18F is a digital camera which comprises: a main body 2501; a display section 2502; a view finder 2503; operation switches 2504; and an image receiving section (not shown in the figure).

Figure 19A:
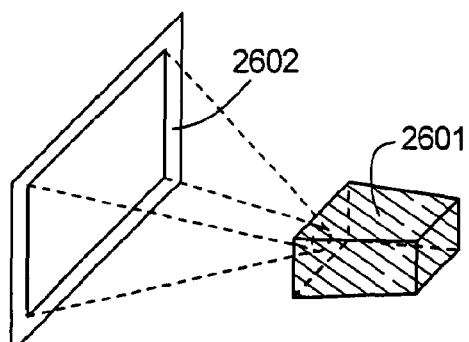
FIGS. 19A to 19D are diagrams showing electronic equipment (Embodiment 7)

FIG. 19A is a front type projector which comprises: a projection system 2601; and a screen 2602. The present invention can be applied to the liquid crystal module 2808 forming a part of the projection system 2601.

Figure 19B:
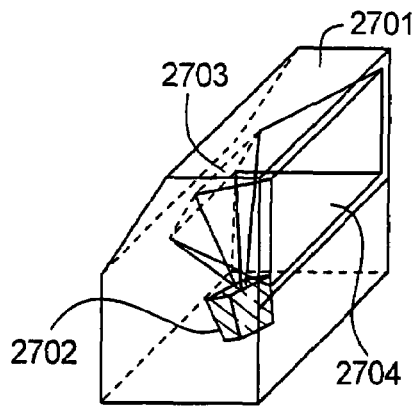

FIG. 19B is a rear type projector which comprises: a main body 2701; a projection system 2702; a mirror 2703; and a screen 2704. The present invention can be applied to the liquid crystal module 2808 forming a part of the projection system 2702.

Figure 19C:
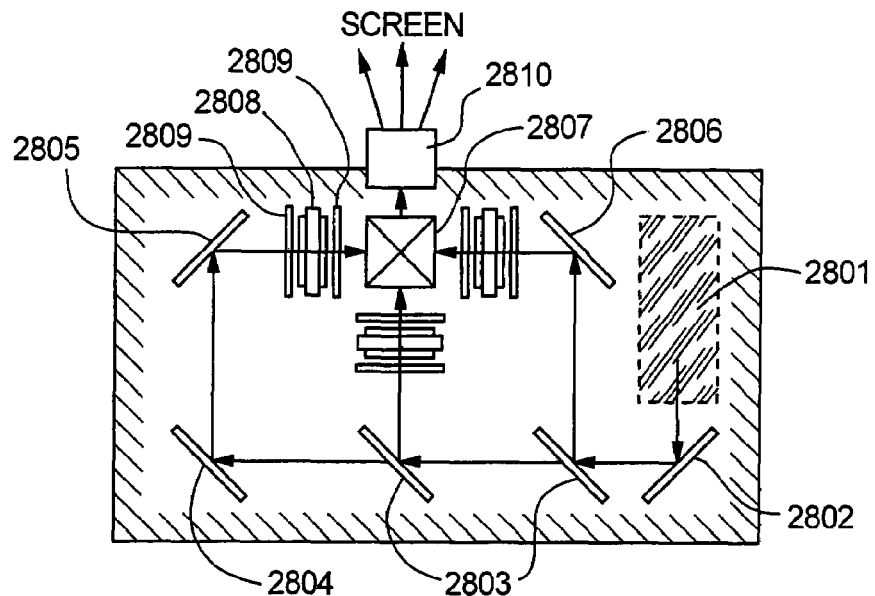

FIG. 19C is a diagram which shows an example of the structure of a projection system 2601 and 2702 in FIGS. 19A and 19B, respectively. Each of projection systems 2601 and 2702 comprises: an optical light source system 2801; mirrors 2802 and 2804 to 2806; a dichroic mirror 2803; a prism 2807; a liquid crystal module 2808; a phase differentiating plate 2809; and a projection optical system 2810. The projection optical system 2810 comprises an optical system having a projection lens. Though this embodiment shows an example of 3-plate type, this is not to limit to this embodiment and a single plate type may be used for instance. Further, an operator may appropriately dispose an optical lens, a film which has a function to polarize light, a film which adjusts a phase difference or an IR film, etc. in the optical path shown by an arrow in FIG. 19C.

Figure 19D:
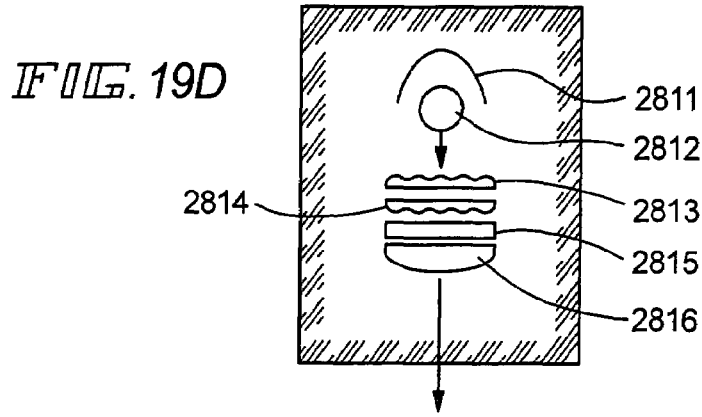

FIG. 19D is a diagram showing an example of a structure of an optical light source system 2801 in FIG. 19C. In this embodiment, the optical light source system 2801 comprises: a reflector 2811; a light source 2812; lens arrays 2813 and 2814; a polarizer conversion element 2815; and a collimator lens 2816. Note that the optical light source system shown in FIG. 19D is merely an example and the structure is not limited to this example. For instance, an operator may appropriately dispose an optical lens, a film which has a function to polarize light, a film which adjusts a phase difference or an IR film, etc.

Note that the projectors shown FIGS. 19A to 19D are the cases of using a transmission type electro-optical device, and applicable examples of a reflection type electro-optical device and an EL module are not shown.

Figure 20A:
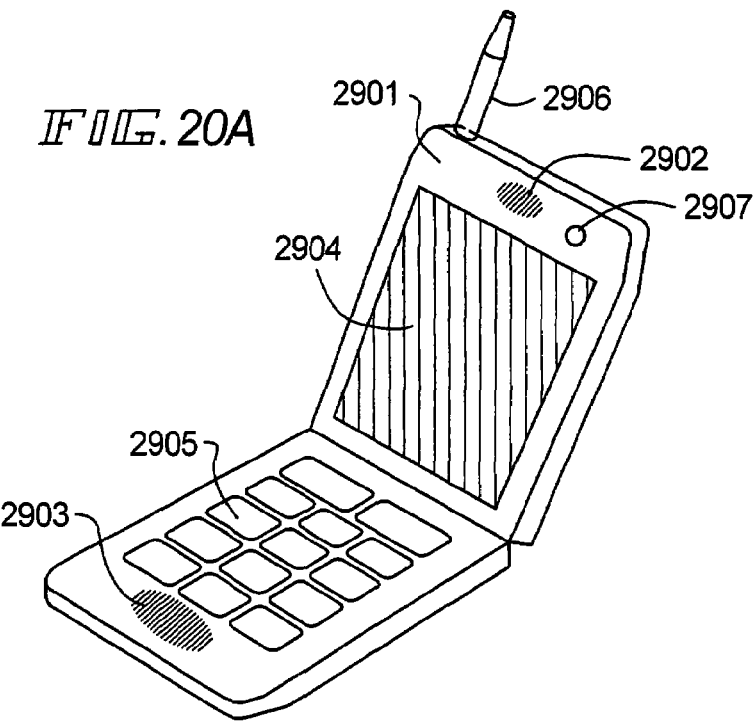
FIGS. 20A to 20C are diagrams showing electronic equipment (Embodiment 7).

FIG. 20A is a portable telephone which comprises: a main body 2901; a voice output section 2902; a voice input section 2903; a display section 2904; operation switches 2905; an antenna 2906; and an image input section (CCD, image sensor, etc.) 2907 etc.

Figure 20B:
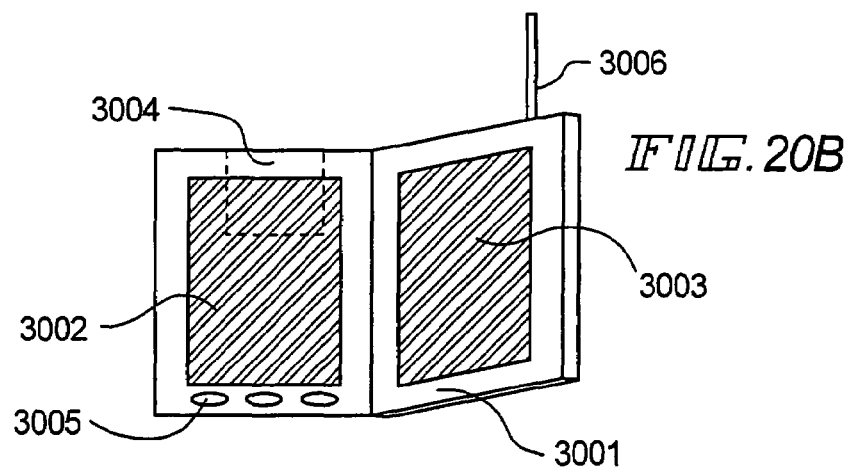

FIG. 20B is a portable book (electronic book) which comprises: a main body 3001; display sections 3002 and 3003; a recording medium 3004; operation switches 3005 and an antenna 3006 etc.

Figure 20C:
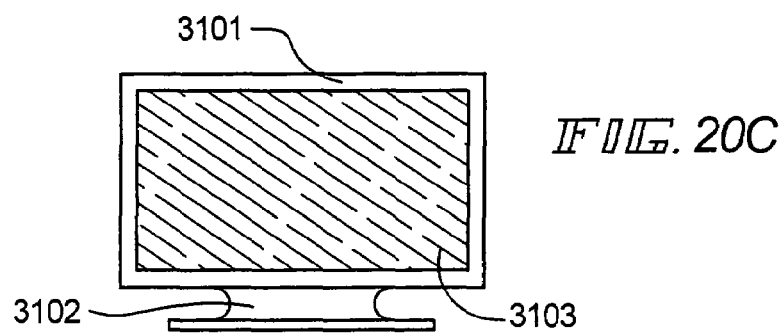

FIG. 20C is a display which comprises: a main body 3101; a supporting section 3102; and a display section 3103 etc. In addition, the display shown in FIG. 20C is small and medium type or large type, for example, screen of the display sized 5 to 20 inches. Moreover, it is preferable to mass-produce by executing a multiple pattern using a substrate sized 1×1 m to form such sized display section.

As described above, the applicable range of the present invention is very large, and the invention can be applied to electronic apparatuses of various areas. Note that the electronic devices of this embodiment can be achieved by utilizing any combination of constitutions in Embodiments 1 to 6.

Embodiment 8

Embodiment 2 shows an example of obtaining a semiconductor film with a crystal structure of uniform crystal grains by doping of a metal element that accelerates crystallization, irradiation of laser light (pulse oscillation excimer laser light) with energy which is not large enough to melt a semiconductor film, and heat treatment. This embodiment shows an example in which a continuous wave laser is employed.

A nickel thin film is formed on a semiconductor film with an amorphous structure in accordance with Embodiment 2. Thereafter, the semiconductor film with an amorphous structure, on which the nickel thin film is formed, is irradiated with laser light (continuous wave laser light) with an energy which is not large enough to melt the semiconductor film.

First, laser light emitted from a 10 W power or 6 W power of continuous wave $YVO_4$ laser is converted into harmonic (second harmonic to fourth harmonic) by a non-linear optical element. Alternatively, $YVO_4$ crystals and a non-linear optical element are put in a resonator to emit harmonic. Then, the harmonic is preferably shaped by an optical system to form a rectangle or an ellipse on the irradiated surface before irradiating the semiconductor film with an amorphous structure.

It is important for the laser light to have an energy which is not large enough to melt the semiconductor film. The energy density is set to 0.01 to 100 $MW/cm^2$ (preferably 0.1 to 10 $MW/cm^2$) and the scanning rate is set to 0.5 to 2000 cm/sec., preferably higher than 200 cm/sec., to make the metal element in the film diffuse uniformly throughout the solid semiconductor film to increase the number of crystal nuclei.

Next, the semiconductor film is crystallized by heat treatment to form a semiconductor film with a crystal structure. Here, heat treatment at 450° C. for an hour is followed by heat treatment at 600° C. for twelve hours. The thus obtained semiconductor film with a crystal structure has a uniform grain size throughout the film.

The obtained semiconductor film with a crystal structure is then patterned to form a semiconductor layer. After washing the surface of the semiconductor layer with an etchant containing fluoric acid, an insulating film mainly containing silicon is formed to serve as a gate insulating film. The surface washing and formation of the gate insulating film are desirably carried out in succession without exposing the substrate to the air. Then, the surface of the gate insulating film is washed and a gate electrode is formed. The semiconductor layer is doped with an impurity element that gives a semiconductor the n-type conductivity (such as P or As), here, phosphorus, to form a source region 209 and a drain region 210. After the doping, the impurity element is activated by heat treatment, irradiation of intense light, or irradiation of laser light. The impurity element is activated, and at the same time, plasma damage to the gate insulating film and plasma damage to the interface between the gate insulating film and the semiconductor layer can be repaired. When heat treatment is employed as activation measures, activation and gettering can be achieved simultaneously. Gettering here utilizes phosphorus doped in the source region or drain region. The metal element that accelerates crystal growth, doped before crystallization, is desirably removed from or reduced in the crystalline semiconductor film through gettering after the crystallization.

The subsequent steps include forming an interlayer insulating film, hydrogenating the semiconductor layer, forming contact holes that reach the source region and the drain region, and forming a source electrode and a drain electrode. A TFT is thus completed.

Although the thus obtained TFT has a plurality of grain boundaries in a channel formation region, it has highly uniform crystal masses. There is little fluctuation between TFTs formed on the same substrate.

This embodiment can be combined with any one of Embodiments 1 through 7.

Embodiment 9

Embodiment 2 shows an example of obtaining a semiconductor film with a crystal structure of uniform crystal grains by doping of a metal element that accelerates crystallization, irradiation of laser light with energy which is not large enough to melt a semiconductor film, and heat treatment. This embodiment shows an example in which a semiconductor film is crystallized without using a metal element that accelerates crystallization.

A semiconductor film with an amorphous structure is formed on a base insulating film in accordance with Embodiment 2.

Next, the semiconductor film is irradiated with laser light with energy which is not large enough to melt the semiconductor film from the front side or back side. The laser light may be light emitted from a pulse oscillation laser or from a continuous wave laser. Examples of laser light that can be employed include light emitted from one or more kinds selected from the group consisting of a pulse oscillation excimer laser, a pulse oscillation Ar laser, a pulse oscillation Kr laser, a continuous wave excimer laser, a continuous wave Ar laser, and a continuous wave Kr laser, or one or more kinds selected from the group consisting of a continuous wave YAG laser, a continuous wave $YVO_4$ laser, a continuous wave YLF laser, a continuous wave $YAlO_3$ laser, a continuous wave glass laser, a continuous wave ruby laser, a continuous wave alexandrite laser, a continuous wave Ti: sapphire laser, a pulse oscillation YAG laser, a pulse oscillation $YVO_4$ laser, a pulse oscillation YLF laser, a pulse oscillation $YAlO_3$ laser, a pulse oscillation glass laser, a pulse oscillation ruby laser, a pulse oscillation alexandrite laser, and a pulse oscillation Ti: sapphire laser.

The energy of laser light in this embodiment is not large enough to melt an amorphous silicon film, is not large enough to change the surface state of the film, and is large enough to allow impurities (typically hydrogen) to move in the solid semiconductor film. When a pulse oscillation laser is employed, the energy density is set to 50 to 150 $mJ/cm^2$.

As has been described, irradiation of laser light with energy which is not large enough to melt a semiconductor film with an amorphous structure before crystallization makes impurities included in the semiconductor film (elements with a high diffusion constant or a high degree of solid solution in the semiconductor film, hydrogen, for example) diffuse in the solid film for improved crystallization later. Hydrogen has higher diffusion constant than nickel and can be diffused in the film by laser light with relatively low energy.

The semiconductor film with an amorphous structure is crystallized next. The film may be crystallized by irradiation of laser light that has an energy large enough to melt the semiconductor film, or by heat treatment using a furnace, or by irradiation of intense light emitted from a lamp.

When laser light with an energy which is large enough to melt the semiconductor film is employed as measures for crystallization, laser irradiation is conducted twice in total (once at an energy level which is not high enough to melt the semiconductor film and once at an energy level which is high enough to melt the semiconductor film). This is preferable because uniform crystallization can be achieved in a short period of time.

If excimer laser light is used as crystallization measures, irradiation of pulse oscillation laser light with an energy density of 50 to 150 $mJ/cm^2$ is immediately followed by irradiation of pulse oscillation laser light with an energy density of 200 mJ/cm² or more for crystallization. If YVO$_4$ laser light is used, irradiation of continuous wave laser light with energy which is not large enough to melt the semiconductor film at a higher scanning rate than 200 cm/sec. is immediately followed by irradiation of continuous wave laser light with energy which is large enough to melt the semiconductor film at a reduced scanning rate, 100 cm/sec. or lower, for crystallization.

In this way, when a semiconductor film with a uniform amorphous structure obtained by irradiation of laser light with energy which is not large enough to melt the semiconductor film is crystallized to obtain a semiconductor film with a uniform crystal structure. Accordingly, TFTs which have as their active layers this semiconductor film with a crystal structure are uniform in characteristics to reduce uneven display and fluctuation in luminance.

Although a metal element that accelerates crystallization is not used in the example shown here, irradiation of laser light with energy which is not large enough to melt a semiconductor film may precede doping of a metal element that accelerates crystallization.

This embodiment can be combined with any one of Embodiments 1 through 8.

According to the present invention, a TFT in which crystal masses have a uniform size and a channel formation region has a plurality of crystal masses can be obtained and a semiconductor device with very little fluctuation is provided. In particular, uneven display due to fluctuation in TFT characteristics can be reduced in a liquid crystal display device. Moreover, the present invention can reduce fluctuation in ON current ($I_{on}$) of TFTs arranged for flowing a constant current (TFTs for supplying a current to a driving circuit or to an OLED in a pixel) in a semiconductor device which has an OLED, and therefore can reduce fluctuation in luminance.

The present invention is also capable of crystallizing a semiconductor film at a lower temperature for heat treatment in a shorter period of time than in prior art.

What is claimed is:

1. A semiconductor device comprising:
   a substrate; and
   a first region comprising a first circuit comprising a first TFT and a second region comprising a second circuit comprising a second TFT and a third circuit comprising a third TFT over the substrate,
   wherein the first TFT comprises a first crystalline semiconductor film as a first active layer,
   wherein the second TFT comprises a second crystalline semiconductor film as a second active layer,
   wherein the third TFT comprises a third crystalline semiconductor film as a third active layer,
   wherein a size of a crystal grain of the first crystalline semiconductor film and a size of crystal grain of the second crystalline semiconductor film are smaller than in a size of a crystal grain of the third crystalline semiconductor film, and
   wherein a fluctuation of sizes of crystal grains of the first crystalline semiconductor film and a fluctuation of size of crystal grain of the second crystalline semiconductor film are smaller than a fluctuation of sizes of crystal grains of the third crystalline semiconductor film.

2. The semiconductor device according to claim 1,
   wherein the size of the crystal grain of the first crystalline semiconductor film is 1 μm to 20 μm, and
   wherein the size of the crystal grain of the second crystalline semiconductor film is 1 μm to 20 μm.

3. The semiconductor device according to claim 1,
   wherein the first active layer comprises a first channel formation region,
   wherein the first channel formation region includes at least two crystal grains in a channel length direction,
   wherein the second active layer comprises a second channel formation region, and
   wherein the second channel formation region includes at least two crystal grains in a channel length direction.

4. The semiconductor device according to claim 1, wherein the semiconductor device is a liquid crystal display device.

5. The semiconductor device according to claim 1, wherein the semiconductor device is an EL module.

6. The semiconductor device according to claim 1, wherein the semiconductor device is a video camera, a digital camera, a navigation system for vehicles, a personal computer, a portable information terminal, or an electronic game machine.

7. A semiconductor device comprising:
   a substrate; and
   a pixel portion comprising a first TFT and a driving circuit comprising a second TFT and a third TFT over the substrate,
   wherein the first TFT comprises a first crystalline semiconductor film as a first active layer,
   wherein the second TFT comprises a second crystalline semiconductor film as a second active layer,
   wherein the third TFT comprises a third crystalline semiconductor film as a third active layer,
   wherein a size of a crystal grain of the first crystalline semiconductor film and a size of a crystal grain of the second crystalline semiconductor film are smaller than in a size of a crystal grain of the third crystalline semiconductor film, and
   wherein a fluctuation of sizes of crystal grains of the first crystalline semiconductor film and a fluctuation of sizes of crystal grains of the second crystalline semiconductor film are smaller than a fluctuation of sizes of crystal grains of the third crystalline semiconductor film.

8. The semiconductor device according to claim 7,
   wherein the size of the crystal grain of the first crystalline semiconductor film is 1 μm to 20 μm, and
   wherein the size of the crystal grain of the second crystalline semiconductor film is 1 μm to 20 μm.

9. The semiconductor device according to claim 7,
   wherein the first active layer comprises a first channel formation region,
   wherein the first channel formation region includes at least two crystal grains in a channel length direction,
   wherein the second active layer comprises a second channel formation region, and
   wherein the second channel formation region includes at least two crystal grains in a channel length direction.

10. The semiconductor device according to claim 7, wherein the semiconductor device is a liquid crystal display device.

11. The semiconductor device according to claim 7, wherein the semiconductor device is an EL module.

12. The semiconductor device according to claim 7, wherein the semiconductor device is a video camera, a digital camera, a navigation system for vehicles, a personal computer, a portable information terminal, or an electronic game machine.

13. A semiconductor device comprising:
   a substrate; and
   a pixel TFT, a TFT of an analog switch circuit, and a TFT of a buffer circuit over the substrate, wherein the pixel TFT comprises a first crystalline semiconductor film as a first active layer, wherein the TFT of analog switch circuit comprises a second crystalline semiconductor film as a second active layer, wherein the TFT of buffer circuit comprises a third crystalline semiconductor film as a third active layer, wherein a size of crystal grain of the first crystalline semiconductor film and a size of crystal grain of the second crystalline semiconductor film are smaller than a size of a crystal grain of the third crystalline semiconductor film, and wherein a fluctuation of size of crystal grain of the first crystalline semiconductor film and a fluctuation of size of crystal grain of the second crystalline semiconductor film are smaller than a fluctuation of sizes of crystal grains of the third crystalline semiconductor film.

14. The semiconductor device according to claim 13,
wherein the size of the crystal grain of the first crystalline semiconductor film is 1 μm to 20 μm, and
wherein the size of the crystal grain of the second crystalline semiconductor film is 1 μm to 20 μm.

15. The semiconductor device according to claim 13,
wherein the first active layer comprises a first channel formation region,
wherein the first channel formation region includes at least two crystal grains in a channel length direction,
wherein the second active layer comprises a second channel formation region, and
wherein the second channel formation region includes at least two crystal grains in a channel length direction.

16. The semiconductor device according to claim 13, wherein the semiconductor device is a liquid crystal display device.

17. The semiconductor device according to claim 13, wherein the semiconductor device is an EL module.

18. The semiconductor device according to claim 13, wherein the semiconductor device is a video camera, a digital camera, a navigation system for vehicles, a personal computer, a portable information terminal, or an electronic game machine.

19. The semiconductor device according to claim 13, wherein the pixel TFT is used as a switching element.

* * * * *